US 9,887,297 B2

(12) United States Patent
Tanaka et al.

(10) Patent No.: US 9,887,297 B2
(45) Date of Patent: Feb. 6, 2018

(54) SEMICONDUCTOR DEVICE COMPRISING OXIDE SEMICONDUCTOR LAYER IN WHICH THICKNESS OF THE OXIDE SEMICONDUCTOR LAYER IS GREATER THAN OR EQUAL TO WIDTH OF THE OXIDE SEMICONDUCTOR LAYER

(71) Applicant: SEMICONDUCTOR ENERGY LABORATORY CO., LTD., Atsugi-shi, Kanagawa-ken (JP)

(72) Inventors: Tetsuhiro Tanaka, Kanagawa (JP); Hiromichi Godo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 162 days.

(21) Appl. No.: 14/484,942

(22) Filed: Sep. 12, 2014

(65) Prior Publication Data

US 2015/0076496 A1    Mar. 19, 2015

(30) Foreign Application Priority Data

Sep. 17, 2013   (JP) .................................. 2013-191505

(51) Int. Cl.
*H01L 29/786*    (2006.01)
*H01L 29/49*    (2006.01)
(Continued)

(52) U.S. Cl.
CPC ...... *H01L 29/7869* (2013.01); *H01L 21/0262* (2013.01); *H01L 21/02554* (2013.01);
(Continued)

(58) Field of Classification Search
CPC ..... H01L 29/7869; H01L 21/16; H01L 21/00; H01L 29/24; H01L 21/479; H01L 21/01; H01L 21/4796
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS 9.13.1 Simple substance and Inorganic compound, Chemistry manual (the 4th edition of revision) basic vol. (II), Sep. 30, 1993, vol. 2, pp. 285-294, Maruzen.
(Continued)

*Primary Examiner* — Allen Parker
*Assistant Examiner* — Long H Le
(74) *Attorney, Agent, or Firm* — Fish & Richardson P.C.

(57) ABSTRACT

A semiconductor device includes a gate electrode having higher Gibbs free energy for oxidation than a gate insulating film. An oxide semiconductor layer having a fin shape is formed over an insulating surface, a gate insulating film is formed over the oxide semiconductor layer, a gate electrode including an oxide layer and facing top and side surfaces of the oxide semiconductor layer with the gate insulating film located therebetween is formed, and then by performing heat treatment, a gate electrode is reduced and oxygen is supplied to the oxide semiconductor layer through the gate insulating film.

20 Claims, 20 Drawing Sheets

(51) Int. Cl.
  *H01L 29/04* (2006.01)
  *H01L 21/477* (2006.01)
  *H01L 21/02* (2006.01)
  *H01L 29/51* (2006.01)
  *H01L 27/12* (2006.01)

(52) U.S. Cl.
  CPC ...... *H01L 21/02565* (2013.01); *H01L 21/477* (2013.01); *H01L 27/1225* (2013.01); *H01L 29/045* (2013.01); *H01L 29/495* (2013.01); *H01L 29/51* (2013.01); *H01L 29/78648* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,045,406 B2 | 5/2006 | Huotari et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,666,730 B2 | 2/2010 | Karve et al. |
| 7,674,650 B2 | 3/2010 | Akimoto et al. |
| 7,732,819 B2 | 6/2010 | Akimoto et al. |
| 8,748,882 B2 | 6/2014 | Terai et al. |
| 9,337,344 B2* | 5/2016 | Hanaoka ............ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199963 A1 | 9/2005 | Aoyama |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140608 A1* | 6/2010 | Park .................... H01L 21/8221 257/43 |
| 2010/0301326 A1* | 12/2010 | Miyairi .............. H01L 27/1225 257/43 |
| 2011/0284844 A1 | 11/2011 | Endo et al. |
| 2012/0061662 A1* | 3/2012 | Yamazaki ......... H01L 29/78648 257/43 |
| 2013/0134412 A1* | 5/2013 | Godo .................... H01L 21/36 257/43 |
| 2013/0134415 A1 | 5/2013 | Godo |
| 2013/0161606 A1* | 6/2013 | Isobe .................... H01L 29/786 257/43 |
| 2013/0221345 A1* | 8/2013 | Ohno ................. H01L 29/78693 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-159908 A | 8/2011 |
| JP | 2012-009836 A | 1/2012 |

(56) References Cited

FOREIGN PATENT DOCUMENTS

| JP | 2013-131740 A | | 7/2013 |
|---|---|---|---|
| JP | 2013-138195 A | | 7/2013 |
| JP | 2013131740 A | * | 7/2013 |
| WO | WO-2004/114391 | | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SIS International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9 and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Hisamoto.D et al., "A Fully Depleted Lean-Channel Transistor (DELTA)—A Novel Vertical Ultrathin SOI MOSFET", IEEE Electron Device Letters, 1990, vol. 11, No. 1, pp. 36-38.

Hisamoto.D et al., "A Folded-channel MOSFET for Deep-sub-tenth Micron Era", IEDM 98: Technical Digest of International Electron Devices Meeting, Dec. 6, 1998, pp. 1032-1034.

\* cited by examiner

4000

4000

4000

4000

4000

4000

CAAC-OS nc-OS

SEMICONDUCTOR DEVICE COMPRISING OXIDE SEMICONDUCTOR LAYER IN WHICH THICKNESS OF THE OXIDE SEMICONDUCTOR LAYER IS GREATER THAN OR EQUAL TO WIDTH OF THE OXIDE SEMICONDUCTOR LAYER

BACKGROUND OF THE INVENTION

1. Field of the Invention

The present invention relates to an object, a method, or a manufacturing method. In addition, the present invention relates to a process, a machine, manufacture, or a composition of matter. In addition, an embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

In recent years, while a transistor is required to be miniaturized with an increase in the degree of integration of integrated circuits (ICs), problems of a decrease in on-state current due to parasitic resistance or deterioration of sub-threshold characteristics become significant as the transistor is further miniaturized. In order to solve the above problems, a transistor mainly including silicon has been proposed as a transistor in which a semiconductor is processed to three-dimensional shape called "fin", whose top surface and side surface are surrounded by a gate electrode (Non-Patent Document 1 and Non-Patent Document 2).

Alternatively, an oxide semiconductor has attracted attention as a semiconductor which can be applied to a transistor. A transistor including an oxide semiconductor can be manufactured easily and operate at higher speed than a transistor including amorphous silicon, and leakage current in the off state is extremely low; thus, the transistor is expected to be applied to an integrated circuit or an image display device (also simply referred to as a display device).

Though it is known that oxygen vacancies in the oxide semiconductor film or the interface cause variation in electric characteristics of the transistor, the problem can be solved by effectively supplying oxygen to the oxide semiconductor film or the interface. As the methods for supplying oxygen to the oxide semiconductor, a method for supplying oxygen from an insulator in contact with the oxide semiconductor (Patent Document 1), and a method for supplying oxygen from a gate electrode (Patent Document 2) are disclosed.

REFERENCE

Patent Document

[Patent Document 1] Japanese Published Patent Application No. 2012-009836
[Patent Document 2] Japanese Published Patent Application No. 2013-131740

Non-Patent Document

[Non-Patent Document 1] IEEE Electron Device Letters Vol. 11, pp. 36-39, 1990
[Non-Patent Document 2] IEEE International Electron Devices Meeting Technical Digest, pp. 1032-1034, 1998

SUMMARY OF THE INVENTION

An object of one embodiment of the present invention is to provide a semiconductor device in which on-state current is large and off-state current is small. Another object is to provide a semiconductor device which has stable electric characteristics. Another object is to provide a novel semiconductor device.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including an oxide semiconductor, a gate electrode, and a gate insulating film. The oxide semiconductor has a fin shape; the gate electrode faces top and side surfaces of the oxide semiconductor; the gate insulating film is provided between the oxide semiconductor and the gate electrode. The gate electrode preferably includes at least a first layer and a second layer, and the first layer of the gate electrode is in contact with the gate insulating film, and the first layer of the gate electrode has lower oxygen concentration than the second layer of the gate electrode.

In the above embodiment, the first layer of the gate electrode preferably includes a substance having higher Gibbs free energy for oxidation than a substance of the gate insulating film.

In the above embodiment, the first layer of the gate electrode preferably includes one or more elements selected from silver, copper, ruthenium, iridium, platinum, and gold.

In the above embodiment, the gate insulating film preferably has an oxygen-transmitting property.

One embodiment of the present invention is a semiconductor device including an oxide semiconductor, a first gate electrode, a second gate electrode, a first gate insulating film, and a second gate insulating film. The oxide semiconductor has a fin shape; the first gate electrode faces top and side surfaces of the oxide semiconductor; the second gate electrode faces a bottom surface of the oxide semiconductor; the first gate insulating film is provided between the oxide semiconductor and the first gate electrode; and the second gate insulating film is provided between the oxide semiconductor and the second gate electrode. Furthermore, the first gate electrode includes at least a first layer and a second layer; the second gate electrode includes at least a first layer and a second layer; the first layer of the first gate electrode is in contact with the first gate insulating film; the first layer of the second gate electrode is in contact with the second gate insulating film; the first layer of the first gate electrode has lower oxygen concentration than the second layer of the first gate electrode; and the first layer of the second gate electrode has lower oxygen concentration than the second layer of the second gate electrode.

In the above embodiment, the first layer of the first gate electrode preferably includes a substance having higher Gibbs free energy for oxidation than a substance of the first gate insulating film. In addition, the first layer of the second gate electrode preferably includes a substance having higher Gibbs free energy for oxidation than a substance of the second gate insulating film.

In the above embodiment, the first layer of the first gate electrode and the first layer of the second gate electrode preferably include one or more elements selected from silver, copper, ruthenium, iridium, platinum, and gold.

In the above embodiment, the first and the second gate insulating films preferably have an oxygen-transmitting property.

One embodiment of the present invention is an electronic device that includes the semiconductor device according to the above embodiment and at least one of a microphone, a speaker, and an operation key.

One embodiment of the present invention is a method for manufacturing a semiconductor device including the steps of forming an oxide semiconductor having a fin shape; forming a gate insulating film over the oxide semiconductor; forming a gate electrode including at least an oxide layer so as to face top and side surfaces of the oxide semiconductor with the gate insulating film located therebetween; and by performing heat treatment, oxygen is supplied from the gate electrode to the oxide semiconductor through the gate insulating film.

One embodiment of the present invention is a method for manufacturing a semiconductor device including the steps of forming a second gate electrode including at least an oxide layer; forming a second gate insulating film over the second gate electrode; forming an oxide semiconductor having a fin shape over the second gate insulating film so as to overlap with the second gate electrode; forming a first gate insulating film over the oxide semiconductor; forming a first gate electrode including at least an oxide layer so as to face top and side surfaces of the oxide semiconductor with the first gate insulating film located therebetween; and by performing heat treatment, oxygen is from the first gate electrode to the oxide semiconductor through the first gate insulating film at the same time as supplying oxygen from the second gate electrode to the oxide semiconductor through the second gate insulating film.

In one embodiment of the present invention, a semiconductor device in which on-state current is high and off-state current is low can be provided. Further, in one embodiment of the present invention, a semiconductor device having stable electric characteristics can be provided. Further, in one embodiment of the present invention, a novel semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Figure 1A:
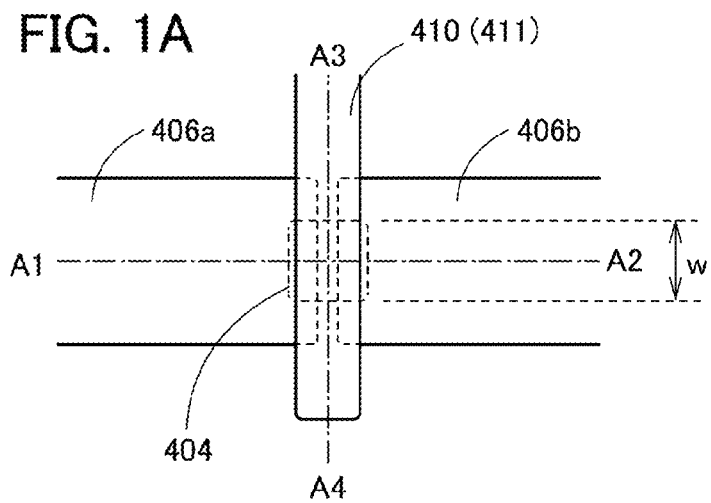
FIGS. 1A to 1C are a top view and cross-sectional views which illustrate a transistor according to one embodiment of the present invention.

Embodiments of the present invention will be described below in detail with reference to the drawings. Note that the present invention is not limited to the description below, and it is easily understood by those skilled in the art that modes and details can be modified in various ways without departing from the scope and spirit of the present invention. Therefore, the present invention should not be interpreted as being limited to the description of the embodiments and examples given below. In addition, in the following embodiments and examples, the same portions or portions having similar functions are denoted by the same reference numerals in different drawings, and description thereof will not be repeated.

Note that in each drawing described in this specification, the size, the film thickness, or the region of each component may be exaggerated for clarity. Therefore, embodiments of the present invention are not necessarily limited to such a scale.

In this specification, ordinal numbers such as "first", "second", and the like are used in order to avoid confusion among components, and the terms do not limit the components numerically. Therefore, for example, the term "first" can be replaced with the term "second", "third", or the like as appropriate.

In this specification and the like, a transistor is an element having at least three terminals of a gate, a drain, and a source. Functions of a source and a drain might be switched when transistors having different polarities are employed or a direction of current flow is changed in circuit operation, for example. Therefore, the terms "source" and "drain" can be switched in this specification and the like.

Embodiment 1

In this embodiment, a transistor according to one embodiment of the present invention will be described with reference to FIGS. 1A to 1C.

Figure 1B:
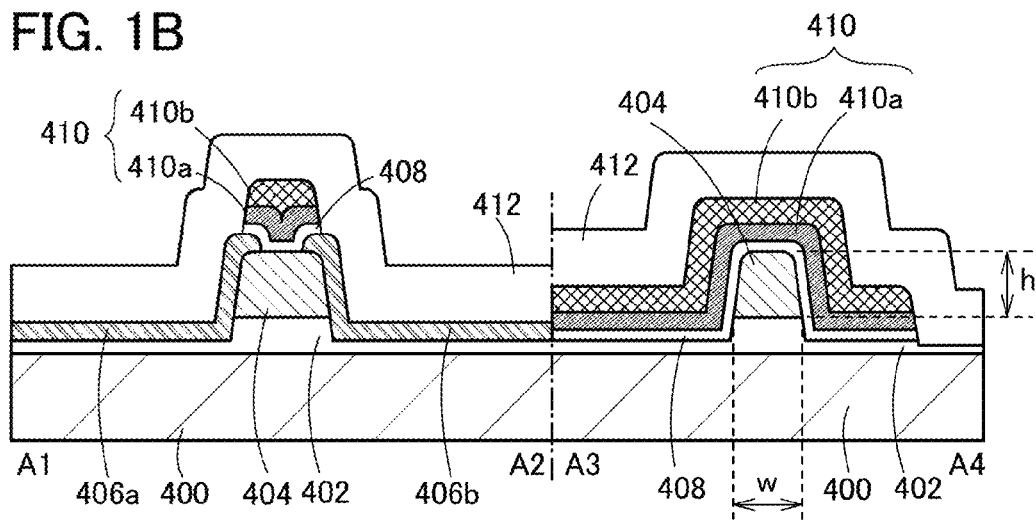

FIGS. 1A and 1B are a top view and a cross-sectional view of a transistor of one embodiment of the present invention. FIG. 1A is a top view and FIG. 1B is a cross-sectional view taken along dashed-dotted line A1-A2 and dashed-dotted line A3-A4 in FIG. 1A. Note that for simplification of the drawing, some components in the top view in FIG. 1A are not illustrated.

The transistor illustrated in FIGS. 1A and 1B includes a substrate 400, a base insulating film 402 having a projecting portion over the substrate 400, an oxide semiconductor 404 over the projecting portion of the base insulating film 402, a source electrode 406a and a drain electrode 406b in contact with a top surface and a side surface of the oxide semiconductor 404, a gate insulating film 408 over the oxide semiconductor 404, the source electrode 406a, and the drain electrode 406b, a gate electrode 410 which is in contact with a top surface of the gate insulating film 408 and faces a top surface and a side surface of the oxide semiconductor 404, and a protective insulating film 412 over the source electrode 406a, the drain electrode 406b, and the gate electrode 410. The gate electrode 410 is formed by a stacked film including a conductive film 410a and a conductive film 410b over the conductive film 410a. Note that the base insulating film 402 does not necessarily include a projecting portion.

At least part (or all) of the source electrode 406a (and/or the drain electrode 406b) is provided on at least part (or all) of a surface, a side surface, a top surface, and/or a bottom surface of a semiconductor, e.g., the oxide semiconductor 404.

Alternatively, at least part (or all) of the source electrode 406a (and/or the drain electrode 406b) is in contact with at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is in contact with at least part (or all) of a semiconductor, e.g., the oxide semiconductor 404.

Alternatively, at least part (or all) of the source electrode 406a (and/or the drain electrode 406b) is electrically connected to at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is electrically connected to at least part (or all) of a semiconductor, e.g., the oxide semiconductor 404.

Alternatively, at least part (or all) of the source electrode 406a (and/or the drain electrode 406b) is provided near at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is provided near at least part (or all) of a semiconductor, e.g., the oxide semiconductor 404.

Alternatively, at least part (or all) of the source electrode 406a (and/or the drain electrode 406b) is provided on a side of at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is provided on a side of at least part (or all) of a semiconductor, e.g., the oxide semiconductor 404.

Alternatively, at least part (or all) of the source electrode 406a (and/or the drain electrode 406b) is provided obliquely above at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is provided obliquely above at least part (or all) of a semiconductor, e.g., the oxide semiconductor 404.

Alternatively, at least part (or all) of the source electrode 406a (and/or the drain electrode 406b) is provided above at least part (or all) of a surface, a side surface, a top surface, and/or a bottom surface of a semiconductor, e.g., the oxide semiconductor 404. Alternatively, at least part (or all) of the source electrode 406a (and/or the drain electrode 406b) is provided above at least part (or all) of a semiconductor, e.g., the oxide semiconductor 404.

The substrate 400 is not limited to a simple support, and may be a substrate where an element such as a transistor or a capacitor is formed. In that case, at least one of the gate electrode 410, the source electrode 406a, and the drain electrode 406b of the transistor may be electrically connected to the above element.

The base insulating film 402 can have a function of supplying oxygen to the oxide semiconductor 404 as well as a function of preventing diffusion of impurities from the substrate 400. Thus, the base insulating film 402 is preferably an insulator containing oxygen. For example, an insulator containing oxygen more than that in the stoichiometric composition is more preferable. Note that in the case where the substrate 400 is a substrate where an element is formed as described above, the base insulating film 402 has also a function as a protective insulating film. In that case, a surface of the base insulating film 402 may be planarized. For example, the base insulating film 402 may be subjected to planarization treatment such as chemical mechanical polishing (CMP) treatment.

As illustrated in FIG. 1B, the oxide semiconductor 404 is formed into a fin shape and the oxide semiconductor 404 is surrounded by the gate electrode 410, whereby the oxide semiconductor 404 can be electrically surrounded by an electric field of the gate electrode 410 (a structure in which an oxide semiconductor is electrically surrounded by an electric field of a gate electrode is referred to as a surrounded channel (s-channel) structure). Since a channel is formed in the entire oxide semiconductor 404 (bulk) in the s-channel structure, high driving capability can be obtained and the problems caused in miniaturizing a transistor such as a decrease in on-state current due to parasitic resistance and an increase in leakage current (off-state current) caused by drain induced barrier lowering (DIBL) can be suppressed. Thus, the s-channel structure is suitable for a miniaturized transistor. For example, the channel length of the transistor is preferably less than or equal to 40 nm, more preferably less than or equal to 30 nm, still more preferably less than or equal to 20 nm and the fin width of the transistor is preferably less than or equal to 40 nm, more preferably less than or equal to 30 nm, still more preferably less than or equal to 20 nm.

Note that a channel length refers to a distance between a source (a source region, a source electrode) and a drain (a drain region, a drain electrode) in a region where a semiconductor overlaps with a gate electrode in the top view. Accordingly, in FIG. 1A, the channel length is the distance between the source electrode 406a and the drain electrode 406b in a region where the oxide semiconductor 404 and the gate electrode 410 overlap with each other. The fin width means a length of the width w of the oxide semiconductor 404 illustrated in FIGS. 1A and 1B.

A fin shape means a shape in which the height h of the oxide semiconductor 404 illustrated in FIG. 1B is greater than or equal to the width w of the oxide semiconductor 404 illustrated in FIG. 1B.

In the case where a higher on-state current is preferred, the height h of the oxide semiconductor 404 is required to be increased in a transistor with an s-channel structure. As the height h is increased, however, it becomes difficult to spread oxygen supplied from the base insulating film 402 over the entire oxide semiconductor 404, so that oxygen vacancies are generated in the oxide semiconductor 404. Oxygen vacancies are a factor of changing electrical characteristics of a transistor.

In this embodiment, a method for solving the problem by giving a gate electrode 410 oxygen supply capability is shown. In addition to the base insulating film 402, the gate electrode 410 can have oxygen supply capability, which allows oxygen to spread over the entire oxide semiconductor 404 even when the height h is increased; thus, increase in on-state current and stabilization of operation of the transistor can both be achieved. The details will be described below.

The conductive film 410a of the gate electrode 410 is a conductive film containing oxygen and includes a substance having higher Gibbs free energy for oxidation than a substance of the gate insulating film 408. That is, the conductive film 410a is more easily reduced than the gate insulating film 408. In other words, the conductive film 410a is more hardly oxidized than the gate insulating film 408. The thickness of the conductive film 410a is preferably greater than or equal to 5 nm and less than or equal to 100 nm, more preferably greater than or equal to 10 nm and less than or equal to 50 nm, still more preferably greater than or equal to 10 nm and less than or equal to 30 nm.

The conductive film 410b of the gate electrode 410 includes a substance having higher conductivity than a substance of the conductive film 410a. It is preferable that the conductive film 410b have a substance whose Gibbs free energy for oxidation is equal to or higher than that of the conductive film 410a. In other words, the conductive film 410b is as difficult as or more difficult to oxidize than the conductive film 410a. The thickness of the conductive film 410b is preferably greater than or equal to 10 nm and less than or equal to 200 nm, more preferably greater than or equal to 30 nm and less than or equal to 100 nm.

The gate insulating film 408 has an oxygen-transmitting property. A film having an oxygen-transmitting property is a film through which oxygen molecules pass, or a film which has a sufficiently high diffusion coefficient of oxygen atoms and through which oxygen atoms pass by heat treatment or the like in a manufacturing process. For example, a film through which oxygen molecules pass has low density such that oxygen molecules can pass through the film. Specifically, the film density is preferably lower than 3.2 g/cm$^3$. A diffusion coefficient of oxygen atoms in the film through which oxygen atoms pass at higher than or equal to 150° C. and lower than or equal to 450° C., although depending on the thickness of the gate insulating film 408, is greater than or equal to $3 \times 10^{-16}$ cm$^2$/s, preferably greater than or equal to $1 \times 10^{-15}$ cm$^2$/s, more preferably greater than or equal to $8 \times 10^{-15}$ cm$^2$/s.

Since the conductive film 410a including oxygen is formed using a substance which is more easily reduced than a substance of the gate insulating film 408, the conductive film 410a is reduced by heat treatment; thus, the conductive film 410a releases oxygen. Here, the conductive film 410b does not take oxygen released from the conductive film 410a away, and even if the oxygen is taken away, the amount thereof is extremely small. Oxygen released from the conductive film 410a passes through the gate insulating film 408 and can reach the oxide semiconductor 404.

The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state.

With the above-described gate electrode 410 and gate insulating film 408, oxygen can be supplied from the gate electrode 410 to the oxide semiconductor 404 through the gate insulating film 408.

Figure 14:
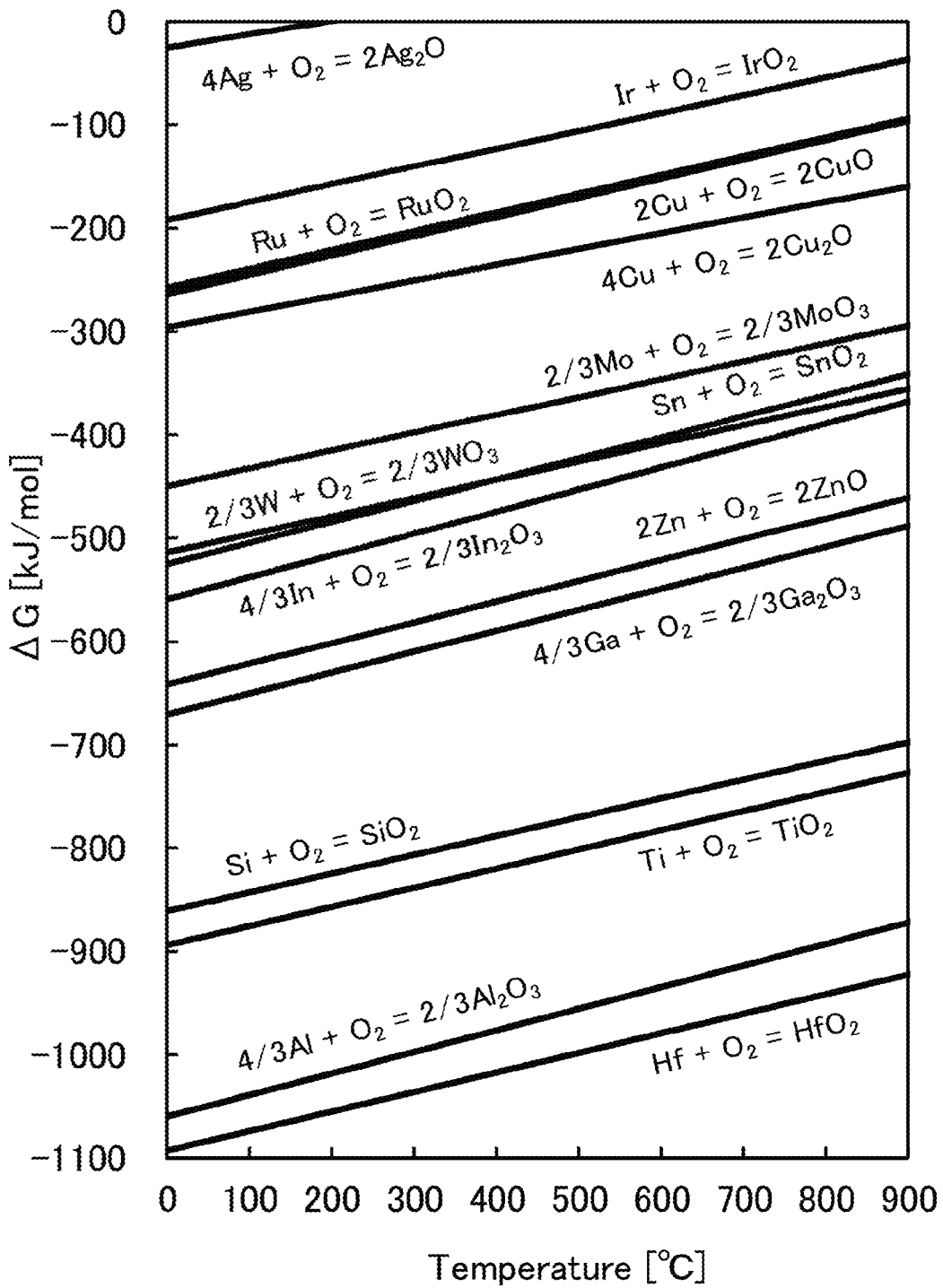
FIG. 14 shows Gibbs free energy for oxidation.

For reference, FIG. 14 shows Gibbs free energy of elements for oxidation. In FIG. 14, the horizontal axis indicates temperature [° C.] and the vertical axis indicates Gibbs free energy ($\Delta G$ [kJ/mol]). The Gibbs free energy for the oxidation shown in FIG. 14 is obtained by the following calculation. First, values of standard enthalpy of formation $\Delta H$ and standard entropy of formation $\Delta S$ of substances in oxidation are calculated by substituting values of standard enthalpy of formation $\Delta H$ and standard entropy S of the substances in Table 1 into respective oxidation equations in Table 2. The obtained values of standard enthalpy of formation $\Delta H$ and standard entropy of formation $\Delta S$ in each oxidation are shown in Table 2. Note that *Chemistry manual (the 4th edition of revision) basic volume (II)* ed. by Chemical Society of Japan, Maruzen Co., Ltd. is mainly referred to for the values of standard enthalpy of formation $\Delta H$ and standard entropy S of the substances in Table 1.

TABLE 1

| Substance | $\Delta H$ [kJ/mol] Standard Enthalpy of Formation | S [J/(Kmol)] Standard Entropy |
|---|---|---|
| $O_2$ | 0 | 205.1 |
| Si | 0 | 18.83 |
| $SiO_2$ | −910.9 | 41.84 |
| In | 0 | 57.82 |
| $In_2O_3$ | −925.8 | 104.2 |
| Ga | 0 | 40.88 |
| $Ga_2O_3$ | −1089 | 84.98 |
| Zn | 0 | 41.63 |
| ZnO | −348.3 | 43.64 |
| Sn | 0 | 51.55 |
| $SnO_2$ | −580.7 | 52.3 |
| Al | 0 | 28.33 |
| $Al_2O_3$ | −1676 | 50.92 |
| W | 0 | 32.64 |
| $WO_3$ | −842.9 | 75.9 |
| Mo | 0 | 28.66 |
| $MoO_3$ | −745.1 | 77.74 |
| Cu | 0 | 33.15 |
| CuO | −157.3 | 42.63 |
| $CuO_2$ | −168.6 | 93.14 |
| Ti | 0 | 30.63 |
| $TiO_2$ (rutile) | −944.7 | 50.33 |
| Hf | 0 | 43.56 |
| $HfO_2$ | −1145 | 59.33 |
| Ru | 0 | 28.53 |
| $RuO_2$ | −307 | 52.2 |
| Ag | 0 | 42.55 |
| $Ag_2O$ | −31.05 | 121.3 |
| Ir | 0 | 35.48 |
| $IrO_2$ | −249.5 | 50.99 |

TABLE 2

| Oxidation Formula | ΔH [kJ/mol]<br>Standard Enthalpy<br>of Formation | ΔS [J/(Kmol)]<br>Standard Entropy<br>of Formation |
| --- | --- | --- |
| $Si + O_2 = SiO_2$ | −910.9 | −182.1 |
| $4/3In + O_2 = 2/3In_2O_3$ | −617.2 | −212.8 |
| $Sn + O_2 = SnO_2$ | −580.7 | −204.4 |
| $4/3Ga + O_2 = 2/3Ga_2O_3$ | −726.1 | −203.0 |
| $2Zn + O_2 = 2ZnO$ | −696.6 | −201.1 |
| $2/3W + O_2 = 2/3WO_3$ | −561.9 | −176.3 |
| $2/3Mo + O_2 = 2/3MoO_3$ | −496.7 | −172.4 |
| $2Cu + O_2 = 2CuO$ | −314.6 | −186.2 |
| $4Cu + O_2 = 2Cu_2O$ | −337.2 | −151.5 |
| $4/3Al + O_2 = 2/3Al_2O_3$ | −1117 | −209.0 |
| $Ti + O_2 = TiO_2$ | −944.7 | −185.4 |
| $Hf + O_2 = HfO_2$ | −1145 | −189.4 |
| $4Ag + O_2 = 2Ag_2O$ | −62.10 | −132.7 |
| $Ru + O_2 = RuO_2$ | −307.0 | −181.5 |
| $Ir + O_2 = IrO_2$ | −249.5 | −189.6 |

Next, values of Gibbs free energy in each oxidation in the temperature range of 0° C. to 900° C. are calculated by substituting the values of standard enthalpy of formation ΔH and standard entropy of formation ΔS shown in Table 2 into Formula (1) below. Note that Tin Formula (1) represents a temperature [K].

[Formula 1]

$$\Delta G = \Delta H - T\Delta S \times 10^{-3} \quad (1)$$

From FIG. 14, the conductive film 410a can be, for example, a layer of an oxide including one or more elements selected from silver, copper, ruthenium, iridium, platinum, and gold. An oxide including the element has high Gibbs free energy for oxidation; thus, the oxide itself is easily reduced and easily oxidizes a film in contact with the oxide. An oxide including ruthenium or iridium is preferably used because of its high conductivity. As examples of an oxide including ruthenium or iridium, $RuO_X$ (X is greater than or equal to 0.5 and less than or equal to 4), $IrO_X$ (X is greater than or equal to 0.5 and less than or equal to 4), or $SrRuO_X$ (X is greater than or equal to 1 and less than or equal to 5) can be given.

The conductive film 410b is a layer including a metal nitride or one or more elements selected from silver, copper, ruthenium, iridium, molybdenum, tungsten, platinum, and gold. The conductive film 410b may be multilayered so as to increase the conductivity. In that case, a layer which is not in contact with conductive film 410a does not necessarily contain the above element and a metal nitride.

The gate insulating film 408 can be formed to have a single-layer or stacked-layer structure using one or more insulators including the following materials: silicon oxide, silicon oxynitride, germanium oxide, yttrium oxide, zirconium oxide, lanthanum oxide, neodymium oxide, hafnium oxide, and tantalum oxide.

Figure 1C:
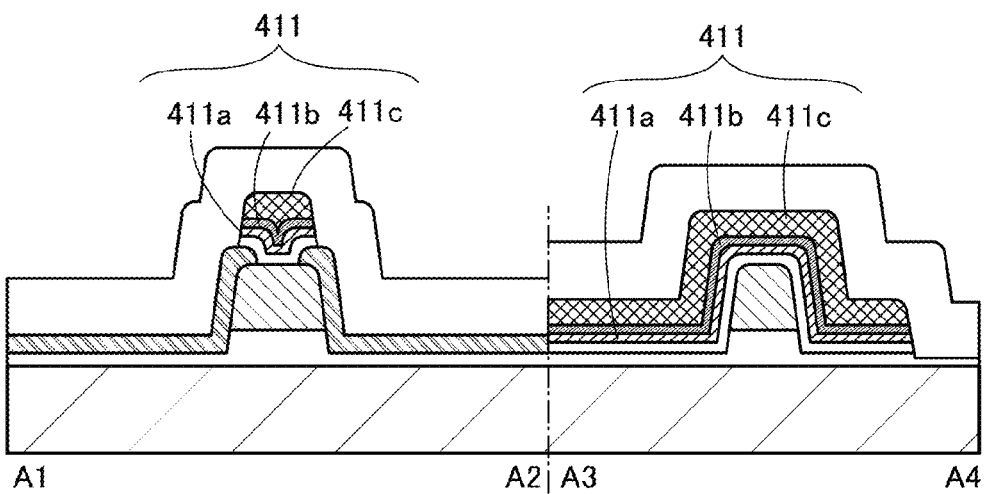

A state in which the conductive film 410a is reduced by performing heat treatment is shown in FIG. 1C.

A gate electrode 411 illustrated in FIG. 1C contains a conductive film 411a, a conductive film 411b, and a conductive film 411c which are stacked in this order from the bottom. In FIG. 1C, the structure is the same as FIG. 1B, except for the gate electrode 411.

The conductive film 411a has lower oxygen concentration than the conductive film 411b, and the conductive film 411c has higher conductivity than the conductive films 411a and 411b.

A region in the vicinity of the gate insulating film 408 is reduced by performing heat treatment, whereby the conductive film 410a illustrated in FIG. 1B is changed to the conductive film 411a having lower oxygen concentration than the conductive film 410a and the conductive film 411b having almost the same oxygen concentration as the conductive film 410a. The conductive film 410b becomes the conductive film 411c without particular change.

The thickness of the conductive film 411a is preferably greater than or equal to 1 nm and less than or equal to 50 nm, further preferably greater than or equal to 1 nm and less than or equal to 30 nm, still further preferably greater than or equal to 1 nm and less than or equal to 15 nm.

The thickness of the conductive film 411b is preferably greater than or equal to 1 nm and less than or equal to 100 nm, further preferably greater than or equal to 1 nm and less than or equal to 50 nm, still further preferably greater than or equal to 1 nm and less than or equal to 30 nm.

Description of the thickness of the conductive film 410b may be referred to for the thickness of the conductive film 411c.

Note that in some cases, the entire region of the conductive film 410a changes into the conductive film 411a depending on the heat treatment conditions. That is, the conductive film 411b is not formed in some cases depending on the heat treatment conditions.

As compared to the case where a substance whose work function is less than or equal to 4.7 eV is used for the conductive film 411a of the gate electrode 411, it is preferable to use a substance whose work function is greater than 5 eV, preferably greater than 5.2 eV, such as iridium, platinum, ruthenium oxide, or gold, which enables the threshold voltage of the NMOS transistor to be shifted more in the positive direction.

As the source electrode 406a and the drain electrode 406b illustrated in FIGS. 1A to 1C, a conductive film capable of extracting oxygen from the oxide semiconductor is preferably used. As an example of the conductive film capable of extracting oxygen from the oxide semiconductor, a conductive film containing aluminum, titanium, chromium, nickel, molybdenum, tantalum, tungsten, or the like can be given.

By the conductive film capable of extracting oxygen from the oxide semiconductor, oxygen in the oxide semiconductor is released to form oxygen vacancies in the oxide semiconductor in some cases. Oxygen is more likely to be extracted as the temperature is higher. Since the manufacturing process of the transistor involves some heat treatment steps, oxygen vacancies are likely to be formed in a region of the oxide semiconductor, which is in contact with the source electrode or the drain electrode. Furthermore, hydrogen enters sites of oxygen vacancies by heating, and thus the oxide semiconductor becomes n-type in some cases. Thus, due to the source electrode and the drain electrode, the resistance of a region where the oxide semiconductor is in contact with the source electrode or the drain electrode is reduced, so that the on-state resistance of the transistor can be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive film capable of appropriately extracting oxygen from an oxide semiconductor may be used as the source electrode and the drain electrode. As the conductive film capable of appropriately extracting oxygen, a conductive film containing nickel, molybdenum, or tungsten can be used, for example.

Furthermore, in the case where a transistor with an extremely short channel length (less than or equal to 40 nm, or less than or equal to 30 nm) is manufactured, a conductive film which is less likely to extract oxygen from an oxide semiconductor may be used as the source electrode 406a and the drain electrode 406b. As an example of the conductive film which is less likely to extract oxygen from an oxide semiconductor, a conductive film containing tantalum nitride, titanium nitride, or ruthenium can be given. Note that plural kinds of conductive films may be stacked.

The protective insulating film 412 can be formed using an insulator containing one or more materials selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. In particular, the aluminum oxide film is preferably used as the protective insulating film 412 because the aluminum oxide film has a high shielding (blocking) effect of preventing transmission of both oxygen and impurities such as hydrogen and moisture. With the protective insulating film 412 capable of blocking oxygen provided in contact with the side surfaces of the conductive film 410a, oxygen can be prevented from being released from the side surfaces of the conductive film 410a when the conductive film 410a is reduced, so that oxygen can be supplied effectively to the oxide semiconductor 404.

The structures, the methods, and the like described in this embodiment can be combined as appropriate with any of the structures, the methods, and the like described in the other embodiments.

Embodiment 2

In this embodiment, details of the oxide semiconductor 404 of Embodiment 1 are described.

The oxide semiconductor 404 is an oxide containing indium. An oxide can have a high carrier mobility (electron mobility) by containing indium, for example. In addition, the oxide semiconductor 404 preferably includes an element M. The element M is aluminum, gallium, yttrium, or tin, for example. The element M is an element having a high bonding energy with oxygen, for example. The element M is an element that can increase the energy gap of the oxide, for example. In addition, the oxide semiconductor 404 preferably contains zinc. When the oxide contains zinc, the oxide is easily crystallized, for example. The energy at the top of the valence band of the oxide can be controlled with the atomic ratio of zinc, for example.

Note that the oxide semiconductor 404 is not limited to the oxide containing indium. The oxide semiconductor 404 may be a Zn—Sn oxide or a Ga—Sn oxide, for example.

As the oxide semiconductor 404, an oxide with a wide energy gap is used. For example, the energy gap of the oxide semiconductor 404 is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide semiconductor 404 can be formed by a sputtering method, a chemical vapor deposition (CVD) method, a metal organic chemical vapor deposition (MOCVD) method, an atomic layer deposition (ALD) method, a thermal CVD method, a plasma enhanced chemical vapor deposition (PECVD) method, a molecular beam epitaxy (MBE) method, or a pulsed laser deposition (PLD) method. In particular, an MOCVD method, an ALD method, or a thermal CVD method is preferably used, in which case the oxide semiconductor 404 is hardly damaged since plasma is not utilized, so that the leakage current in the off state of the transistor can be kept low.

For example, in the case where an oxide semiconductor $InGaZnO_X$ (X>0) film is formed by a thermal CVD method, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $(CH_3)_2Zn$. Without limitation to the above combination, triethylgallium (chemical formula: $Ga(C_2H_5)_3$) can be used instead of trimethylgallium and diethylzinc (chemical formula: $(C_2H_5)_2Zn$) can be used instead of dimethylzinc.

For example, when the oxide semiconductor $InGaZnO_X$ (X>0) film is formed by an ALD method, an $In(CH_3)_3$ gas and an $O_3$ gas are sequentially introduced plural times to form an $InO_2$ layer, a $Ga(CH_3)_3$ gas and an $O_3$ gas are introduced at the same time to form a GaO layer, and then a $(CH_3)_2Zn$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is bubbled with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas or tris(acetylacetonato)indium may be used. Note that tris (acetylacetonato)indium is also referred to as $In (acac)_3$. In addition, instead of a $Ga(CH_3)_3$ gas, a $Ga(C_2H_5)_3$ gas or tris(acetylacetonato)gallium may be used. Note that tris (acetylacetonato)gallium is also referred to as $Ga(acac)_3$. Further, instead of an $In(CH_3)_3$ gas, an $In(C_2H_5)_3$ gas may be used. Furthermore, a $(CH_3)_2Zn$ gas or zinc acetate may be used. However, the deposition gas is not limited to these.

In the case where the oxide semiconductor 404 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor 404 is formed by a sputtering method, the atomic ratio of In to M and Zn contained in the target may be 3:1:1, 3:1:2, 3:1:4, 1:1:0.5, 1:1:1, 1:1:2, 1:4:4 or the like.

In the cases where the oxide semiconductor 404 is formed by a sputtering method, films having atomic ratios different from the atomic ratios of the targets may be formed. Especially for zinc, the atomic ratio of zinc in a deposited film is smaller than the atomic ratio of the target in some cases. Specifically, the film has an atomic ratio of zinc of 40 atomic % to about 90 atomic % of the atomic ratio of zinc in the target.

An influence of impurities in the oxide semiconductor 404 is described below. In order to obtain stable electrical characteristics of a transistor, it is effective to reduce the concentration of impurities in the oxide semiconductor 404 so that the oxide semiconductor 404 has a lower carrier density and is highly purified. The carrier density of the oxide semiconductor 404 is set to be lower than $1\times10^{17}/cm^3$, lower than $1\times10^{15}/cm^3$, or lower than $1\times10^{13}/cm^3$. In order to reduce the concentration of impurities in the oxide semiconductor 404, the concentration of impurities in a film which is adjacent to the oxide semiconductor 404 are preferably reduced.

For example, silicon in the oxide semiconductor 404 might serve as a carrier trap or a carrier generation source. Therefore, the concentration of silicon in a region between the oxide semiconductor 404 and the base insulating film 402 measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor 404 and the gate insulating film 408 measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor 404, the carrier density is increased in some cases. The concentration of hydrogen in the oxide semiconductor 404 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor 404, the carrier density is increased in some cases. The concentration of nitrogen in the oxide semiconductor 404 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the base insulating film 402 in order to reduce the concentration of hydrogen in the oxide semiconductor 404. The concentration of hydrogen in the base insulating film 402 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the base insulating film 402 in order to reduce the concentration of nitrogen in the oxide semiconductor 404. The concentration of nitrogen in the base insulating film 402 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the gate insulating film 408 in order to reduce the concentration of hydrogen in the oxide semiconductor 404. The concentration of hydrogen in the gate insulating film 408 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the gate insulating film 408 in order to reduce the concentration of nitrogen in the oxide semiconductor 404. The concentration of nitrogen in the gate insulating film 408 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

A structure of an oxide semiconductor which can be used as the oxide semiconductor 404 is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a configuration reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 17A:
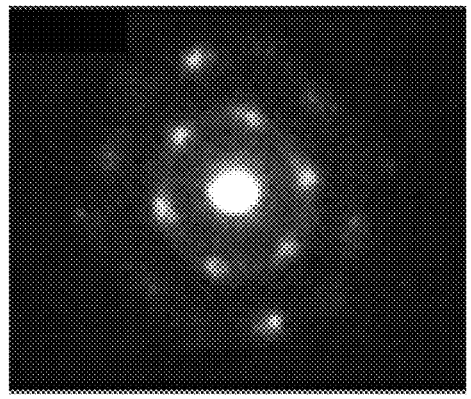
FIGS. 17A and 17B illustrate nanobeam electron diffraction patterns of an oxide semiconductor film.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 17A).

From the results of the high-resolution cross-sectional TEM image and the high-resolution plan TEM image, it is found that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm² or more, 5 μm² or more, or 1000 μm² or more is observed in some cases in the plan high-resolution TEM image.

A CAAC-OS film is subjected to structural analysis with an X-ray diffraction (XRD) apparatus. For example, when the CAAC-OS film including an InGaZnO₄ crystal is analyzed by an out-of-plane method, a peak appears when the diffraction angle (2θ) is around 31° in some cases. This peak is derived from the (009) plane of the InGaZnO₄ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears when 2θ is around 56° in some cases. This peak is derived from the (110) plane of the InGaZnO₄ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO₄, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO₄ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

Figure 17B:
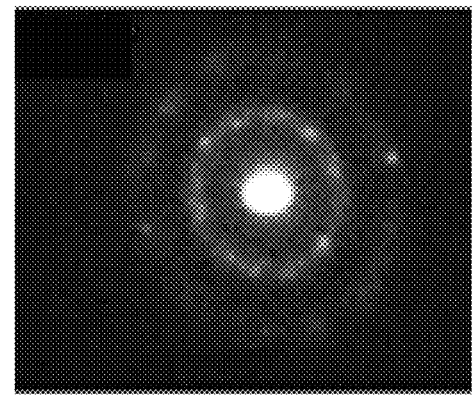

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots may be observed (see FIG. 17B).

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of crystal part of the a-like OS film and the nc-OS film. Note that the crystal part whose size is 0.8 nm or larger is selectively evaluated.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 18A:
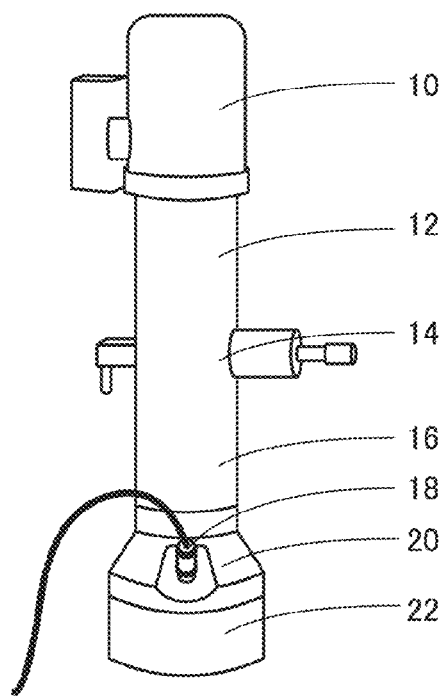
FIGS. 18A and 18B illustrate an example of a transmission electron diffraction measurement apparatus.

FIG. 18A illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 18B:
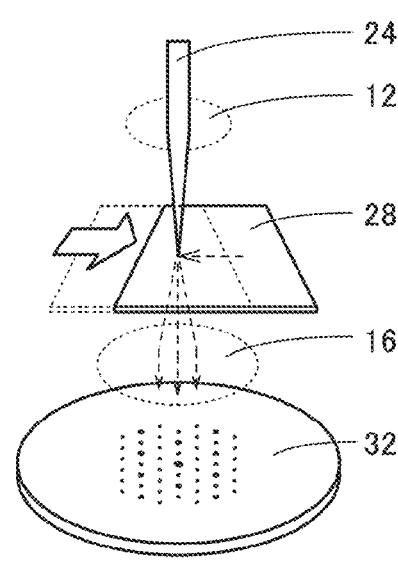

FIG. 18B illustrates an internal structure of the transmission electron diffraction measurement apparatus illustrated in FIG. 18A. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24 enter. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm.

The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 24 that are a nanobeam in the substance, as illustrated in FIG. 18B. At this time, when the substance 28 is a CAAC-OS film, a diffraction pattern shown in FIG. 17A can be observed. When the substance 28 is an nc-OS film, a diffraction pattern shown in FIG. 17B can be observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). For example, in the case of a favorable CAAC-OS film, the proportion of CAAC is 60% or higher, preferably 80% or higher, further preferably 90% or higher, still further preferably 95% or higher. Note that a region where a diffraction pattern different from that of a CAAC-OS film is observed is referred to as the proportion of not-CAAC.

As an example, transmission electron diffraction patterns were obtained by scanning the top surfaces of samples. One of the samples had a CAAC-OS film immediately after film formation (referred to as as-depo), after heat treatment at 350° C., or after heat treatment at 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

Figure 19:
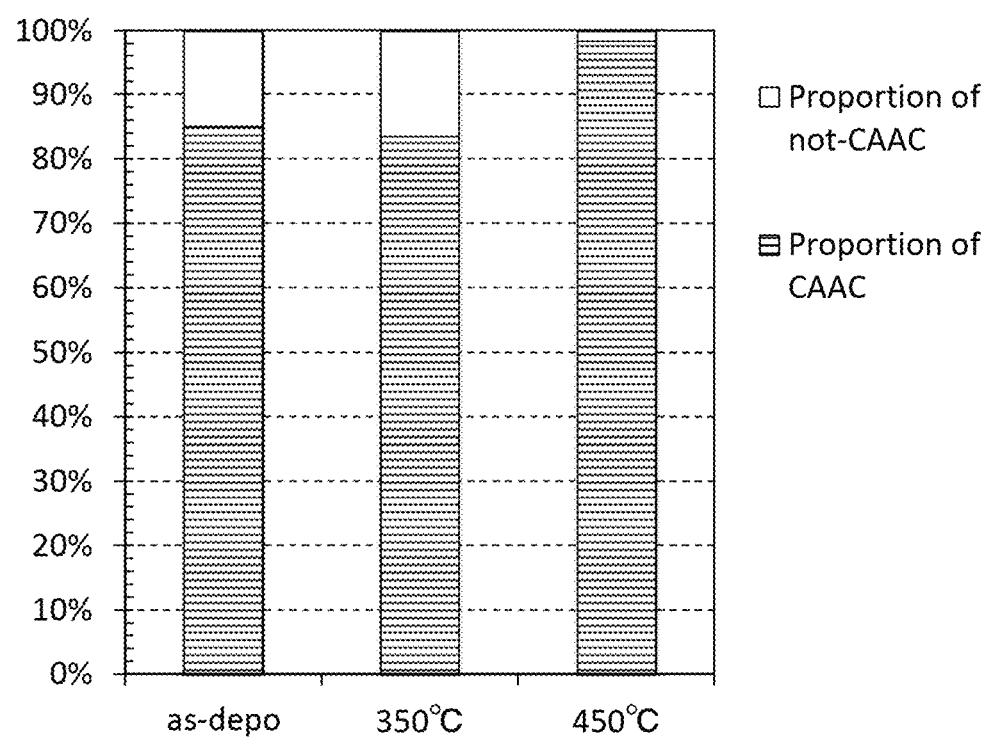
FIG. 19 illustrates an example of a structure analysis by transmission electron diffraction measurement.

FIG. 19 shows the proportion of CAAC in each sample. The proportion of CAAC of the sample after heat treatment at 450° C. is high compared to those of the sample of as-depo and the sample after heat treatment at 350° C. That is, by heat treatment at a temperature higher than 350° C. (for example, 400° C. or higher), the proportion of not-CAAC is lowered (the proportion of CAAC is increased). Here, most of diffraction patterns different from that of a CAAC-OS film are diffraction patterns similar to that of an nc-OS film. Accordingly, by heat treatment, a region having a structure similar to an nc-OS film is affected by the structure of an adjacent region, and becomes a CAAC region.

With such a measurement method, the structure of an oxide semiconductor film having a plurality of structures can be analyzed in some cases.

The oxide semiconductor 404 may be a stack of oxide semiconductors. For example, the oxide semiconductor 404 may have a two-layer structure or a three-layer structure.

Figure 2:
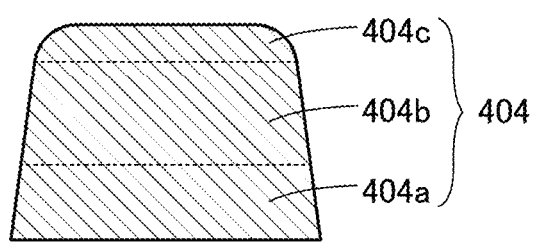
FIG. 2 is a cross sectional view of a stacked layer structure included in a semiconductor device of one embodiment of the present invention.

For example, the case where the oxide semiconductor 404 has a three-layer structure is described. In FIG. 2, the oxide semiconductor 404 includes an oxide semiconductor 404a, an oxide semiconductor 404b, and an oxide semiconductor 404c stacked in this order from the bottom.

For the oxide semiconductor 404b (middle layer), the above description of the oxide semiconductor 404 can be referred to. The oxide semiconductor 404a (bottom layer) and the oxide semiconductor 404c (top layer) include one or more elements other than oxygen included in the oxide semiconductor 404b. Thus, an interface state is less likely to be formed at the interface between the oxide semiconductor 404a and the oxide semiconductor 404b and the interface between the oxide semiconductor 404b and the oxide semiconductor 404c.

In the case of using an In-M-Zn oxide as the oxide semiconductor 404a, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case of using an In-M-Zn oxide as the oxide semiconductor 404b, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor 404c, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the oxide semiconductor 404c may be an oxide that is a type the same as that of the oxide semiconductor 404a.

Here, in some cases, there is a mixed region of the oxide semiconductor 404a and the oxide semiconductor 404b between the oxide semiconductor 404a and the oxide semiconductor 404b. Further, in some cases, there is a mixed region of the oxide semiconductor 404b and the oxide semiconductor 404c between the oxide semiconductor 404b and the oxide semiconductor 404c. The mixed region has a low density of interface states. For that reason, the stack of the oxide semiconductor 404a, the oxide semiconductor 404b, and the oxide semiconductor 404c has a band structure where energy at each interface and in the vicinity of the interface is changed continuously (continuous junction).

As the oxide semiconductor 404b, an oxide having an electron affinity higher than those of the oxide semiconductors 404a and 404c is used. For example, as the oxide semiconductor 404b, an oxide having an electron affinity higher than those of the oxide semiconductors 404a and 404c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

At this time, when an electric field is applied to the gate electrode 410, a channel is formed in the oxide semiconductor 404b having the highest electron affinity in the oxide semiconductor 404a, the oxide semiconductor 404b, and the oxide semiconductor 404c.

To increase the on-state current of the transistor, the thickness of the oxide semiconductor 404c is preferably as small as possible. The thickness of the oxide semiconductor 404c is set to be less than 10 nm, preferably less than or equal to 5 nm, further preferably less than or equal to 3 nm, for example. Meanwhile, the oxide semiconductor 404c has a function of blocking elements other than oxygen (such as silicon) included in the gate insulating film 408 from entering the oxide semiconductor 404b where a channel is formed. For this reason, it is preferable that the oxide semiconductor 404c have a certain thickness. The thickness of the oxide semiconductor 404c is set to be greater than or equal to 0.3 nm, preferably greater than or equal to 1 nm, further preferably greater than or equal to 2 nm, for example.

To improve reliability, preferably, the thickness of the oxide semiconductor 404a is large and the thickness of the oxide semiconductor 404c is small. Specifically, the thickness of the oxide semiconductor 404a is set to be greater than or equal to 20 nm, preferably greater than or equal to 30 nm, further preferably greater than or equal to 40 nm, still further preferably greater than or equal to 60 nm. With the oxide semiconductor 404a having a thickness greater than or equal to 20 nm, preferably greater than or equal to 30 nm, further preferably greater than or equal to 40 nm, still further preferably greater than or equal to 60 nm, the distance from the interface between the base insulating film 402 and the oxide semiconductor 404a to the oxide semiconductor 404b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor 404a is set to be less than or equal to 200 nm, preferably less than or equal to 120 nm, further preferably less than or equal to 80 nm.

For example, the concentration of silicon in a region between the oxide semiconductor 404b and the oxide semiconductor 404a measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the oxide semiconductor 404b and the oxide semiconductor 404c measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

It is preferable to reduce the concentration of hydrogen in the oxide semiconductor 404a and the oxide semiconductor 404c in order to reduce the concentration of hydrogen in the oxide semiconductor 404b. The concentration of hydrogen in the oxide semiconductor 404a and the oxide semiconductor 404c measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the oxide semiconductor 404a and the oxide semiconductor 404c in order to reduce the concentration of nitrogen in the oxide semiconductor 404b. The concentration of nitrogen in the oxide semiconductor 404a and the oxide semiconductor 404c measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The above three-layer structure is an example. For example, a two-layer structure without the oxide semiconductor 404a or the oxide semiconductor 404c may be employed.

This embodiment can be implemented in combination with any of the other embodiments as appropriate.

Embodiment 3

Next, a method for manufacturing the transistor in Embodiment 1 is described with reference to FIGS. 3A to 3C and FIG. 5.

Figure 3A:
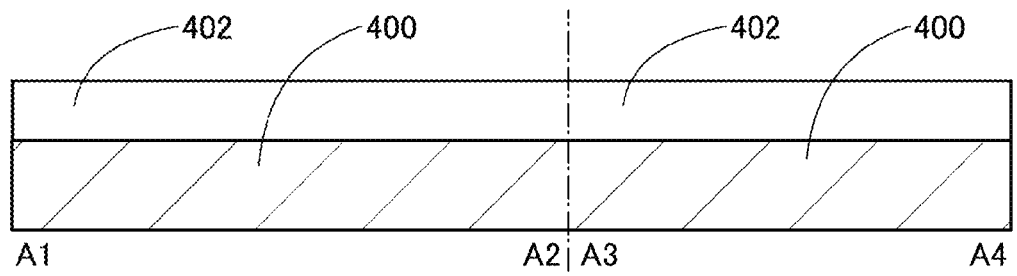
FIGS. 3A to 3C are cross-sectional views illustrating a method for manufacturing a transistor of one embodiment of the present invention.

First, the base insulating film 402 is formed over the substrate 400 (see FIG. 3A).

The base insulating film 402 can be deposited by a sputtering method, a CVD method (including an ALD method, an MOCVD method, a thermal CVD method, and a PECVD method), an MBE method, or a PLD method. In particular, an ALD method, an MOCVD method, or a thermal CVD method are preferably used, in which case the base insulating film 402 is hardly damaged since plasma is not utilized.

Then, in order to planarize the surface of the base insulating film 402, CMP treatment may be performed. By CMP treatment, the base insulating film 402 has an average surface roughness (Ra) of less than or equal to 1 nm, preferably less than or equal to 0.3 nm, more preferably less than or equal to 0.1 nm. In some cases, Ra that is less than or equal to the above value can increase the crystallinity of the oxide semiconductor 404. Ra can be measured using an atomic force microscope (AFM).

Then, oxygen may be added to the base insulating film 402 so that an insulating layer containing excess oxygen can be formed. Oxygen may be added by plasma treatment, an ion implantation method, or the like. In the case where the addition of oxygen may be performed by an ion implantation method, the acceleration voltage may be higher than or equal to 2 kV and lower than or equal to 100 kV and the dose is greater than or equal to $5 \times 10^{14}$ ions/cm$^2$ and less than or equal to $5 \times 10^{16}$ ions/cm$^2$, for example.

Figure 3B:
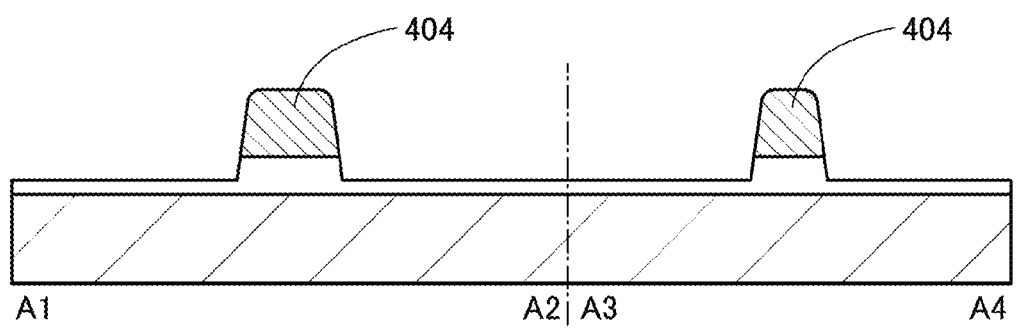

Next, the oxide semiconductor 404 is formed over the base insulating film 402 with the method described in Embodiment 2 (see FIG. 3B). At this time, the base insulating film 402 may be appropriately etched. By etching the base insulating film 402 appropriately, the gate electrode 410 to be formed later can cover the oxide semiconductor 404 easily. Note that in order to miniaturize the transistor, a hard mask may be used in processing the oxide semiconductor 404.

Furthermore, in the case where the stacked film including the oxide semiconductor 404a, the oxide semiconductor 404b, and the oxide semiconductor 404c illustrated in FIG. 2 is formed as the oxide semiconductor 404, it is preferable that the layers be successively formed without exposure to the air.

In order to obtain an oxide semiconductor in which entry of impurities is decreased and which has high crystallinity, the oxide semiconductor 404 is formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor 404 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor 404 can be improved, and in addition, impurities such as hydrogen and water can be removed from the base insulating film 402.

Figure 3C:
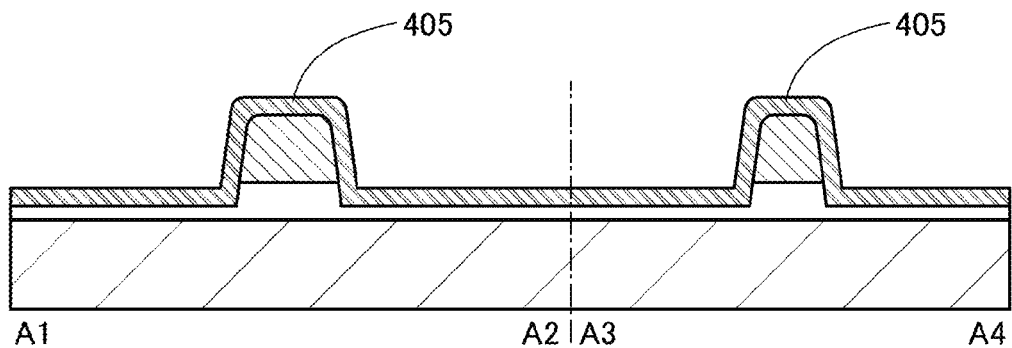

Next, a conductive film 405 to be the source electrode 406a and the drain electrode 406b is formed over the oxide semiconductor 404 (see FIG. 3C). The conductive film 405 can be deposited by a sputtering method, a CVD method (including an ALD method, an MOCVD method, a thermal CVD method, and a PECVD method), an MBE method, or a PLD method. In particular, an ALD method, an MOCVD method, or a thermal CVD method is preferably used, in which case the conductive film 405 is hardly damaged since plasma is not utilized.

For example, in the case where a tungsten film is formed as the conductive film 405 by an ALD method, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 4A:
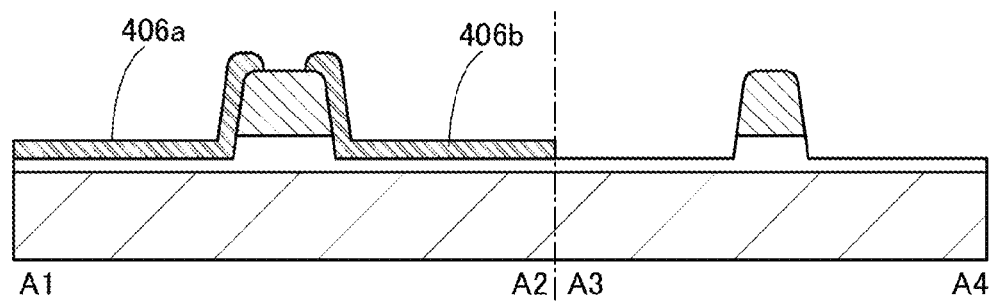
FIGS. 4A to 4C are cross-sectional views illustrating a method for manufacturing a transistor of one embodiment of the present invention.

Next, the conductive film 405 is divided by etching to form the source electrode 406a and the drain electrode 406b (see FIG. 4A). Note that when the conductive film 405 is etched, end portions of the source electrode 406a and the drain electrode 406b are rounded (curved) in some cases. Furthermore, when the conductive film 405 is etched, the base insulating film 402 and the oxide semiconductor 404 may be etched appropriately.

Next, the gate insulating film 408 is formed over the oxide semiconductor 404, the source electrode 406a, and the drain electrode 406b. The gate insulating film 408 can be deposited by a sputtering method, a CVD method (including an ALD method, an MOCVD method, a thermal CVD method and a PECVD method), an MBE method, or a PLD method. In particular, an ALD method, an MOCVD method, or a thermal CVD method is preferably used, in which case the gate insulating film 408 is hardly damaged since plasma is not utilized.

For example, in the case where a silicon oxide film is formed as the gate insulating film 408 by a thermal CVD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

For example, in the case where a hafnium oxide film is formed as the gate insulating film 408 by a thermal CVD method, two kinds of gases, i.e., ozone (O3) as an oxidizer and a source material gas which is obtained by vaporizing liquid containing a solvent and a hafnium precursor compound (a hafnium alkoxide solution, typically tetrakis(dimethylamide)hafnium (TDMAH) are used. Note that the chemical formula of tetrakis(dimethylamide)hafnium is $Hf[N(CH_3)_2]_4$. Examples of another material liquid include tetrakis(ethylmethylamide)hafnium.

Figure 4B:
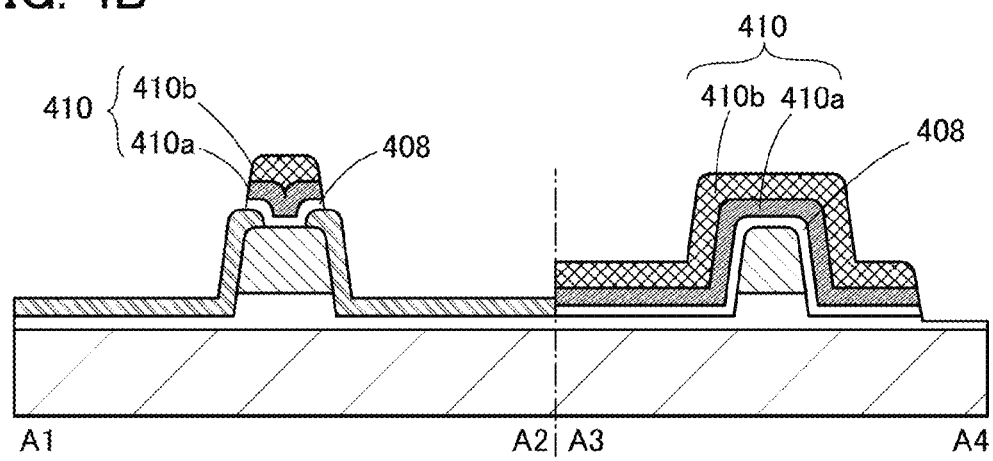

Next, the conductive film 410a and the conductive film 410b are formed over the gate insulating film 408 to form the gate electrode 410 (see FIG. 4B). The conductive film 410a and the conductive film 410b can be deposited by a sputtering method, a CVD method (including an ALD method, an MOCVD method, a thermal CVD method, and a PECVD method), an MBE method, or a PLD method. In particular, an ALD method, an MOCVD method, or a thermal CVD method is preferably used, in which case the conductive film 410a and the conductive film 410b are hardly damaged since plasma is not utilized.

Figure 4C:
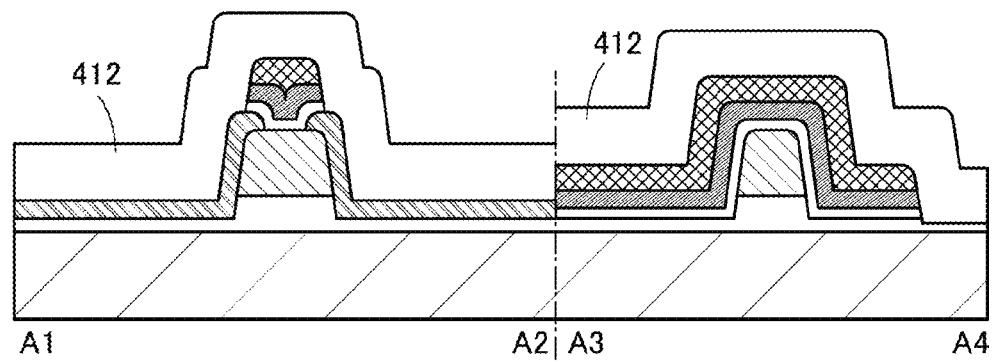
Figure 5:
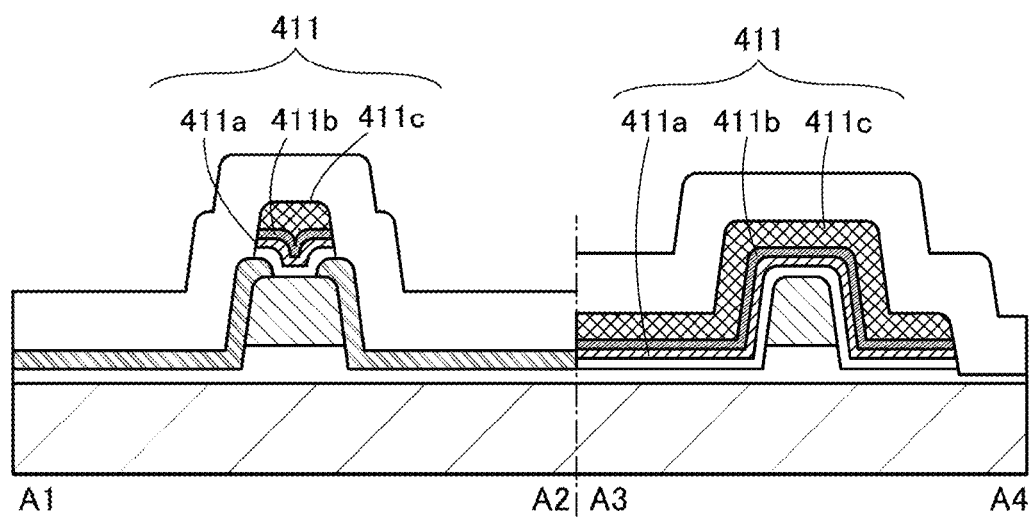
FIG. 5 is a cross-sectional view illustrating a method for manufacturing a transistor of one embodiment of the present invention.

Next, the protective insulating film 412 is formed over the source electrode 406a, the drain electrode 406b, the gate insulating film 408, and the gate electrode 410 (see FIG. 4C). The protective insulating film 412 can be deposited by a sputtering method, a CVD method (including an ALD method, an MOCVD method, a thermal CVD method, and a PECVD method), an MBE method, or a PLD method. In particular, an ALD method, an MOCVD method, or a thermal CVD method is preferably used, in which case the protective insulating film 412 is hardly damaged since plasma is not utilized.

For example, in the case where an aluminum oxide film is formed as a protective insulating film 412 by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate).

Next, second heat treatment is performed. The second heat treatment can be performed in conditions similar to those of the heat treatment in Embodiment 1. The gate electrode 410 is reduced by the second heat treatment to form the conductive film 411a, the conductive film 411b, and the conductive film 411c (see FIG. 5). At this time, oxygen released from the conductive film 410a is supplied to the oxide semiconductor 404 through the gate insulating film 408, whereby oxygen vacancies in the oxide semiconductor 404 are reduced.

Through the above steps, the transistor described in Embodiment 1 can be manufactured.

The structures, the methods, and the like described in this embodiment can be combined as appropriate with any of the structures, the methods, and the like described in the other embodiments.

Embodiment 4

In this embodiment, the case where a bottom gate electrode (a gate electrode which exists between the oxide semiconductor and the substrate) is added to the transistor described in Embodiment 1 will be described with reference to drawings.

Figure 6A:
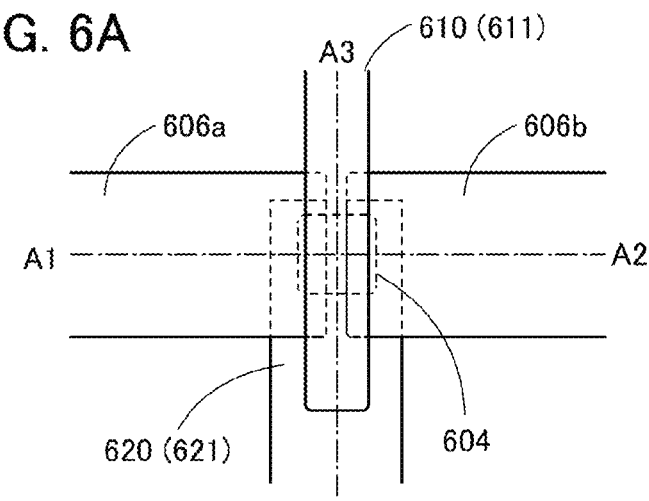
FIGS. 6A to 6C are a top view and cross-sectional views which illustrate a transistor of one embodiment of the present invention.
Figure 6B:
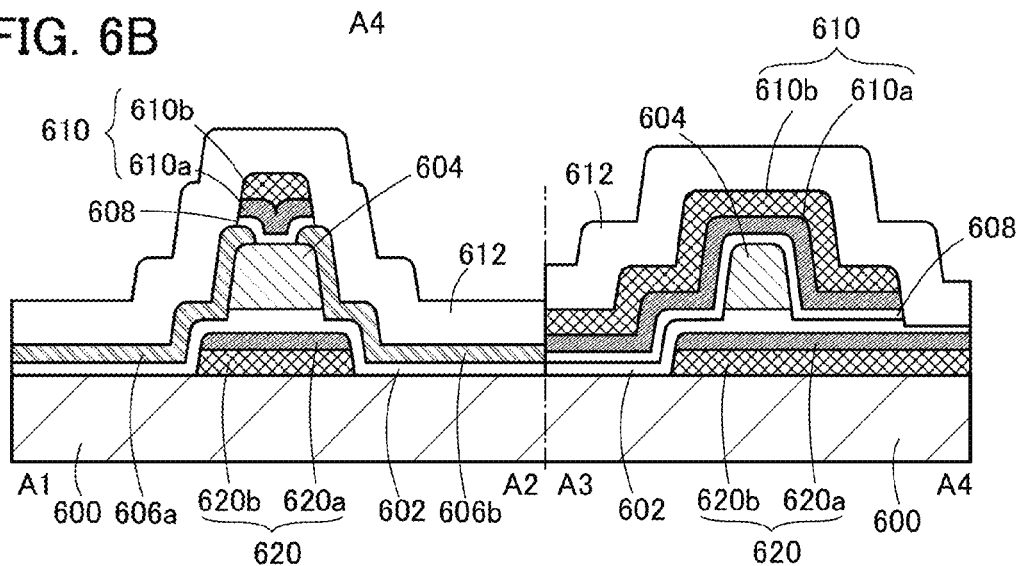

FIGS. 6A and 6B are a top view and a cross-sectional view of a transistor of one embodiment of the present invention. FIG. 6A is a top view and FIG. 6B is a cross-sectional view taken along dashed-dotted line A1-A2 and dashed-dotted line A3-A4 in FIG. 6A. Note that for simplification of the drawing, some components are not illustrated in the top view in FIG. 6A.

The transistor illustrated in FIGS. 6A and 6B includes a substrate 600; a first gate electrode 620 over the substrate 600; a first gate insulating film 602 over the substrate 600 and the first gate electrode 620; an oxide semiconductor 604 overlapping with the first gate electrode 620 with the first gate insulating film 602 provided therebetween; a source electrode 606a and a drain electrode 606b in contact with a top surface and side surfaces of the oxide semiconductor 604; a second gate insulating film 608 over the oxide semiconductor 604, a source electrode 606a, and the drain electrode 606b; a second gate electrode 610 which is in contact with a top surface of the second gate insulating film 608 and faces a top surface and side surfaces of the oxide semiconductor 604; a protective insulating film 612 over the source electrode 606a, the drain electrode 606b, and the second gate electrode 610. The first gate electrode 620 is a stack including a conductive film 620b and a conductive film 620a over the conductive film 620b, and the second gate electrode 610 is a stack including a conductive film 610a and a conductive film 610b over the conductive film 610a. Note that a base insulating film may be formed between the substrate 600 and the first gate electrode 620.

In FIG. 6B, since the first gate electrode 620 and the second gate electrode 610 are not connected to each other, they may be supplied with different potentials or may be electrically connected to each other and supplied with the same potential.

For the conductive film 610a and the conductive film 620a, the description of the conductive film 410a in Embodiment 1 is referred to. For the conductive film 610b and the conductive film 620b, the description of the conductive film 410b described in Embodiment 1 is referred to. For the first gate insulating film 602 and the second gate insulating film 608, the description of the gate insulating film 408 in Embodiment 1 is referred to. As for the other components, the descriptions of respective components which correspond to FIG. 1B can be referred to.

Figure 6C:
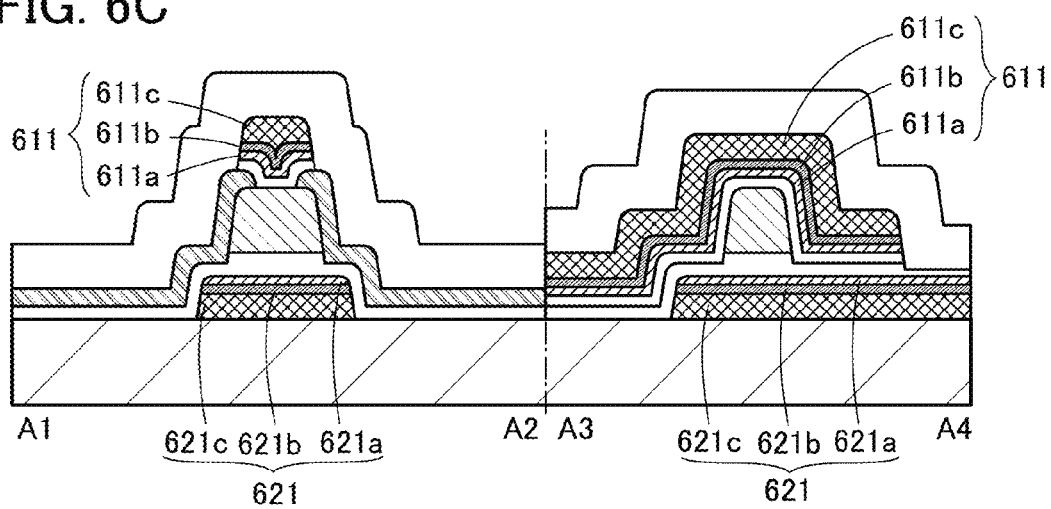

A state in which the conductive film 610a and the conductive film 620a are reduced by performing heat treatment is shown in FIG. 6C.

FIG. 6C illustrates a first gate electrode 621 including a conductive film 621c, a conductive film 621b over the conductive film 621c, and a conductive film 621a over the conductive film 621b; and a second gate electrode 611 including a conductive film 611a, a conductive film 611b over the conductive film 611a, and a conductive film 611c over the conductive film 611b. In FIG. 6C, the structure is the same as FIG. 6B, except for the first gate electrode 621 and the second gate electrode 611.

For the conductive film 611a and the conductive film 621a, the description of the conductive film 411a in Embodiment 1 is referred to. For the conductive film 611b and the conductive film 621b, the description of the conductive film 411b in Embodiment 1 is referred to. For the conductive film 611c and the conductive film 621c, the description of the conductive film 411c in Embodiment 1 is referred to.

As in Embodiment 1, an object of this embodiment is to supply oxygen released by reducing the conductive film 620a and the conductive film 610a, to the oxide semiconductor 604.

The transistor described in Embodiment 1 includes the base insulating film 402 with a supplying oxygen capability under the oxide semiconductor 404, and the amount of oxygen which can be supplied is increased by increasing the thickness of the base insulating film 402. Although the transistor described in this embodiment includes the first gate insulating film 602 under the oxide semiconductor 604, the first gate insulating film 602 cannot be formed thick in terms of gate capacitance; thus, oxygen cannot be supplied sufficiently. Therefore, in the transistor described in this embodiment, it is very important to supply oxygen from the gate electrodes positioned over and under the oxide semiconductor.

Embodiment 5

In this embodiment, an example of a circuit including the transistor of one embodiment of the present invention is described with reference to drawings.

Figure 7A:
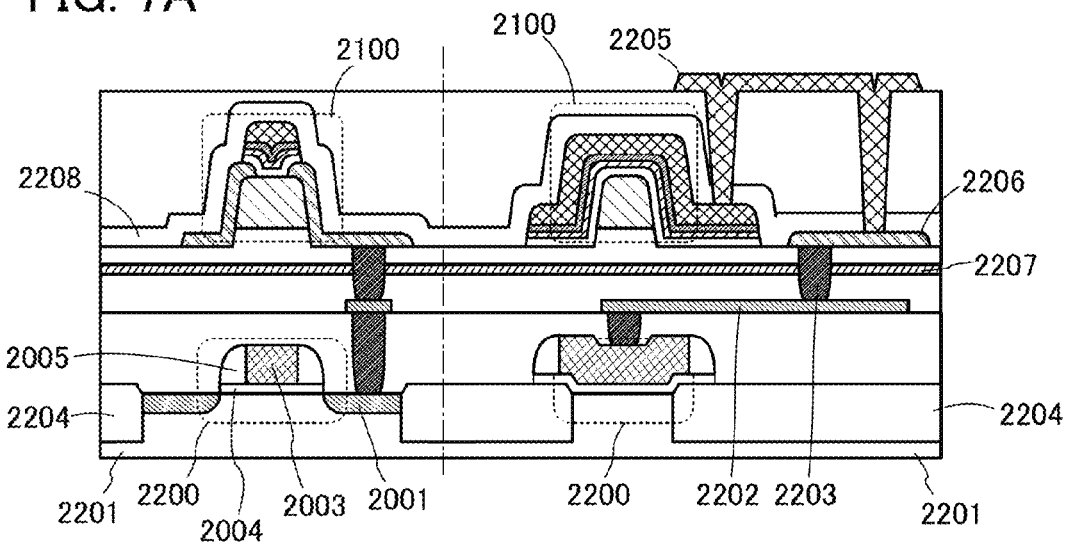
FIGS. 7A to 7D are cross-sectional views and circuit diagrams of a semiconductor device of one embodiment.

FIG. 7A is a cross-sectional view of a semiconductor device of one embodiment of the present invention. The semiconductor device illustrated in FIG. 7A includes a substrate 2201, a transistor 2200, a transistor 2100, a wiring 2202, a plug 2203, a wiring 2206, a wiring 2205, an element separation layer 2204, an insulating layer 2207, and an insulating layer 2208. The transistor 2200 includes an impurity region 2001 functioning as a source region and a drain region, a gate electrode 2003, a gate insulating film 2004, and a sidewall insulating layer 2005.

The semiconductor device illustrated in FIG. 7A includes the transistor 2200 containing a first semiconductor material in a lower portion and the transistor 2100 containing a second semiconductor material in an upper portion. In FIG. 7A, an example is described in which the transistor described in Embodiment 1 as an example is used as the transistor 2100 containing the second semiconductor material. A cross-sectional view of the transistor 2100 and the transistor 2200 in a channel length direction is on the left side of a dashed-dotted line, and a cross-sectional view of the transistor 2100 and the transistor 2200 in a channel width direction is on the right side of the dashed-dotted line.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

Moreover, the transistor 2200 is provided with an impurity region functioning as a Lightly Doped Drain (LDD) region or an extension region under the sidewall insulating layer 2005. In particular, when the transistor 2200 is an n-channel transistor, the LDD region or the extension region are preferably provided in order to suppress the deterioration due to hot carriers.

As the transistor 2200, a transistor containing silicide (salicide) or a transistor which does not include a sidewall insulating layer 2005 may be used. When a structure that contains silicide is used, resistance of the source region and the drain region can be further lowered and the speed of the semiconductor device is increased. Further, the semiconductor device can be operated at low voltage; thus, power consumption of the semiconductor device can be reduced.

The stack of the two kinds of transistors reduces the area occupied by the circuit, allowing a plurality of circuits to be highly integrated.

As the substrate 2201, a single crystal semiconductor substrate or a polycrystalline semiconductor substrate of silicon or silicon carbide, a compound semiconductor substrate of silicon germanium, a silicon-on-insulator (SOI) substrate, or the like may be used. A transistor manufactured using a semiconductor substrate can operate at high speed easily. In the case of using a p-type single crystal silicon substrate as the substrate 2201, an impurity element imparting n-type conductivity may be added to part of the substrate 2201 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2201 can be an insulating substrate provided with a semiconductor film. Examples of the insulating substrate include a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. As examples of glass substrate, a barium borosilicate glass substrate, an alumino-borosilicate glass substrate, or a soda lime glass substrate can be given. Examples of a flexible substrate include a flexible synthetic resin such as plastics typified by polyethylene terephthalate (PET), polyethylene naphthalate (PEN), and polyether sulfone (PES), and acrylic. Examples of the attachment film are attachment films formed using polypropylene, polyester, polyvinyl fluoride, and polyvinyl chloride. Examples of a base film are base films formed using polyester, polyamide, polyimide, aramid, epoxy, an inorganic vapor a deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability is formed, high heat resistance can be provided, or reduction in weight or thickness can be achieved.

The transistor 2200 is separated from other transistors formed on the substrate 2201 by the element separation layer 2204. The element separation layer 2204 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

Here, in the case where a silicon-based semiconductor material is used for the transistor 2200 provided in a lower layer, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper layer, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating layer 2207 having a function of preventing diffusion of hydrogen is provided between the transistors 2100 and 2200. The insulating layer 2207 makes hydrogen remain in the lower layer, thereby improving the reliability of the transistor 2200. In addition, since the insulating layer 2207 suppresses diffusion of hydrogen from the lower layer to the upper layer, the reliability of the transistor 2100 also can be improved.

The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating layer 2208 having a function of preventing diffusion of hydrogen is preferably formed over the transistor 2100 to cover the transistor 2100 including an oxide semiconductor layer. For the insulating layer 2208, a material that is similar to that of the insulating layer 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating layer 2208 covering the transistor 2100, release of oxygen from the oxide semiconductor layer included in the transistor 2100 can be prevented and entry of water and hydrogen into the oxide semiconductor layer can be prevented.

Note that the transistor 2200 can be a transistor of various types without being limited to a planar type transistor. For example, a fin-type transistor, a tri-gate transistor can be applied. An example of a cross-sectional view in this case is shown in FIG. 7D. An insulating layer 2212 is provided over a semiconductor substrate 2211. The semiconductor substrate 2211 includes a protruding portion with a thin tip (also referred to a fin). Note that an insulating film may be provided over the protruding portion. The insulating film functions as a mask for preventing the semiconductor substrate 2211 from being etched when the protruding portion is formed. Alternatively, the protruding portion may not have the thin tip; a protruding portion with a cuboid-like protruding portion and a protruding portion with a thick tip are permitted, for example. A gate insulating film 2214 is provided over the protruding portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the protruding portion; however, a semiconductor device of one embodiment of the present invention is not limited thereto. For example, a semiconductor region having a protruding portion may be formed by processing an SOI substrate.

In FIGS. 7A and 7D, regions where reference numerals and hatching patterns are not given show regions formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

Figure 7B:
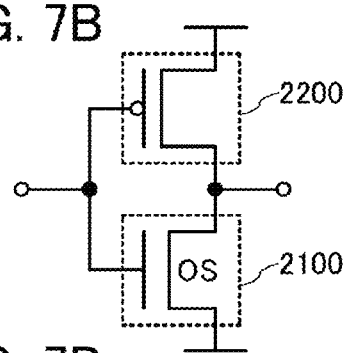

A circuit diagram in FIG. 7B shows a configuration of a so-called CMOS circuit in which the p-channel transistor 2200 and the n-channel transistor 2100 are connected to each other in series and in which gates of them are connected to each other.

Figure 7C:
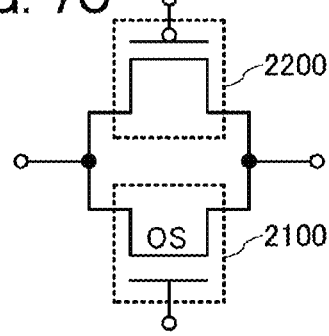
Figure 7D:
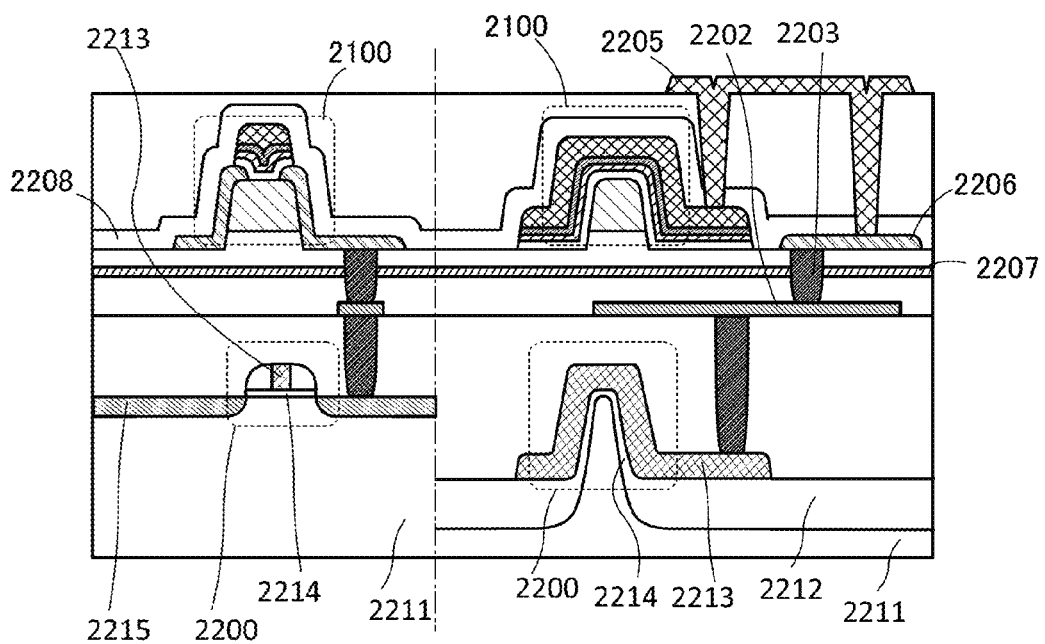

A circuit diagram in FIG. 7C shows a configuration in which sources of the transistors 2100 and 2200 are connected to each other and drains of the transistors 2100 and 2200 are connected to each other. With such a configuration, the transistors can function as a so-called analog switch.

Figure 8A:
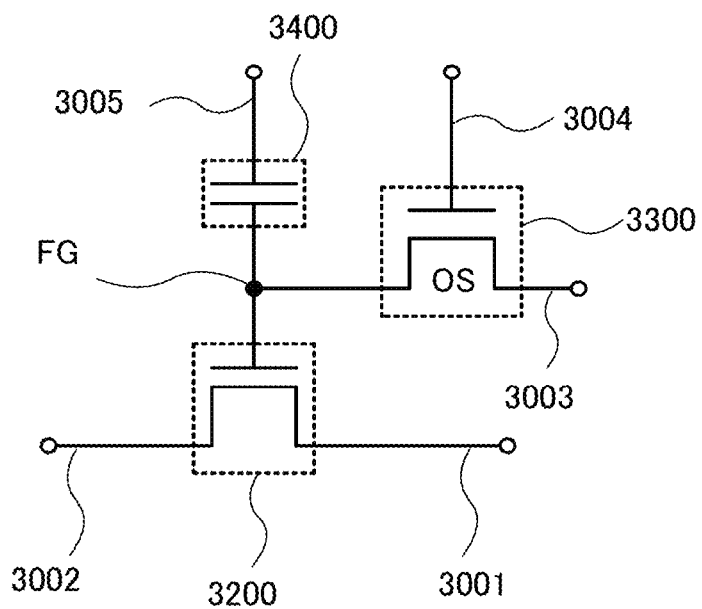
FIGS. 8A and 8B illustrate a structure example of a memory device of one embodiment.
Figure 8B:
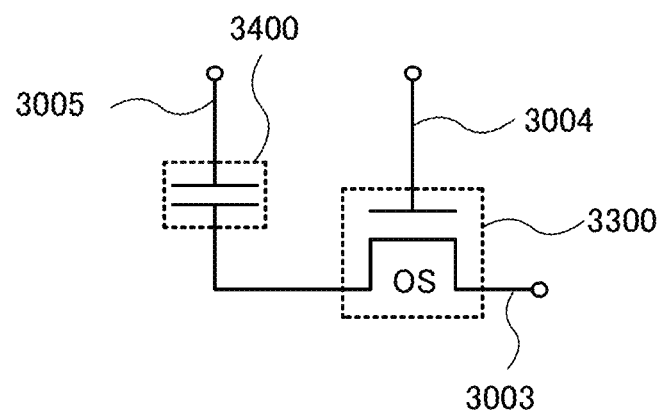

An example of a semiconductor device (memory device) which includes the transistor of one embodiment of the present invention, which can retain stored data even when not powered, and which has an unlimited number of write cycles is shown in FIGS. 8A and 8B.

The semiconductor device illustrated in FIG. 8A includes a transistor 3200 including a first semiconductor material, a transistor 3300 including a second semiconductor material, and a capacitor 3400. As the transistor 3300, the transistor described in Embodiment 1 can be used.

The transistor 3300 is a transistor in which a channel is formed in a semiconductor layer including an oxide semiconductor. Since the off-state current of the transistor 3300 is low, stored data can be retained for a long period owing to such a transistor. In other words, refresh operation becomes unnecessary or the frequency of the refresh operation in a semiconductor memory device can be extremely low, which leads to a sufficient reduction in power consumption.

In FIG. 8A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to the first terminal of the capacitor 3400. A fifth wiring 3005 is electrically connected to the second terminal of the capacitor 3400.

The semiconductor device in FIG. 8A utilizes a feature that the potential of the gate electrode of the transistor 3200 can be held, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, charge for supplying either of two different potential levels (hereinafter referred to as low-level charge and high-level charge) is given. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data holded in the gate electrode can be read by determining the potential of the second wiring 3002.

Note that in the case where memory cells are arrayed to be used, only data of desired memory cells needs to be read. The fifth wiring 3005 in the case where data is not read may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

A semiconductor device illustrated in FIG. 8B is different from the semiconductor device illustrated in FIG. 8A in that the transistor 3200 is not provided. Also in this case, writing and retaining operation of data can be performed in a manner similar to the semiconductor device illustrated in FIG. 8A.

Next, reading of data in the semiconductor device in FIG. 8B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)(C_B + C)$) is higher than the potential of the third wiring 3003 in the case of retaining the potential $V_0$ ($=(C_B \times V_{B0} + C \times V_0)(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Embodiment 6

In this embodiment, an RFID tag that includes the transistor described in the above embodiments or the memory device described in the above embodiment is described with reference to FIG. 9.

An RFID tag in this embodiment includes a memory circuit inside, stores information which is necessary for the memory circuit, and transmits and receives information to/from the outside by using contactless means, for example, wireless communication. With these characteristics, an RFID tag can be used for an individual authentication system in which an object or the like is recognized by reading the individual information, for example. In order that an RFID tag is used for such application, extremely high reliability is needed.

A structure of an RFID tag will be described with reference to FIG. 9. FIG. 9 is a block diagram illustrating a structure example of an RFID tag.

Figure 9:
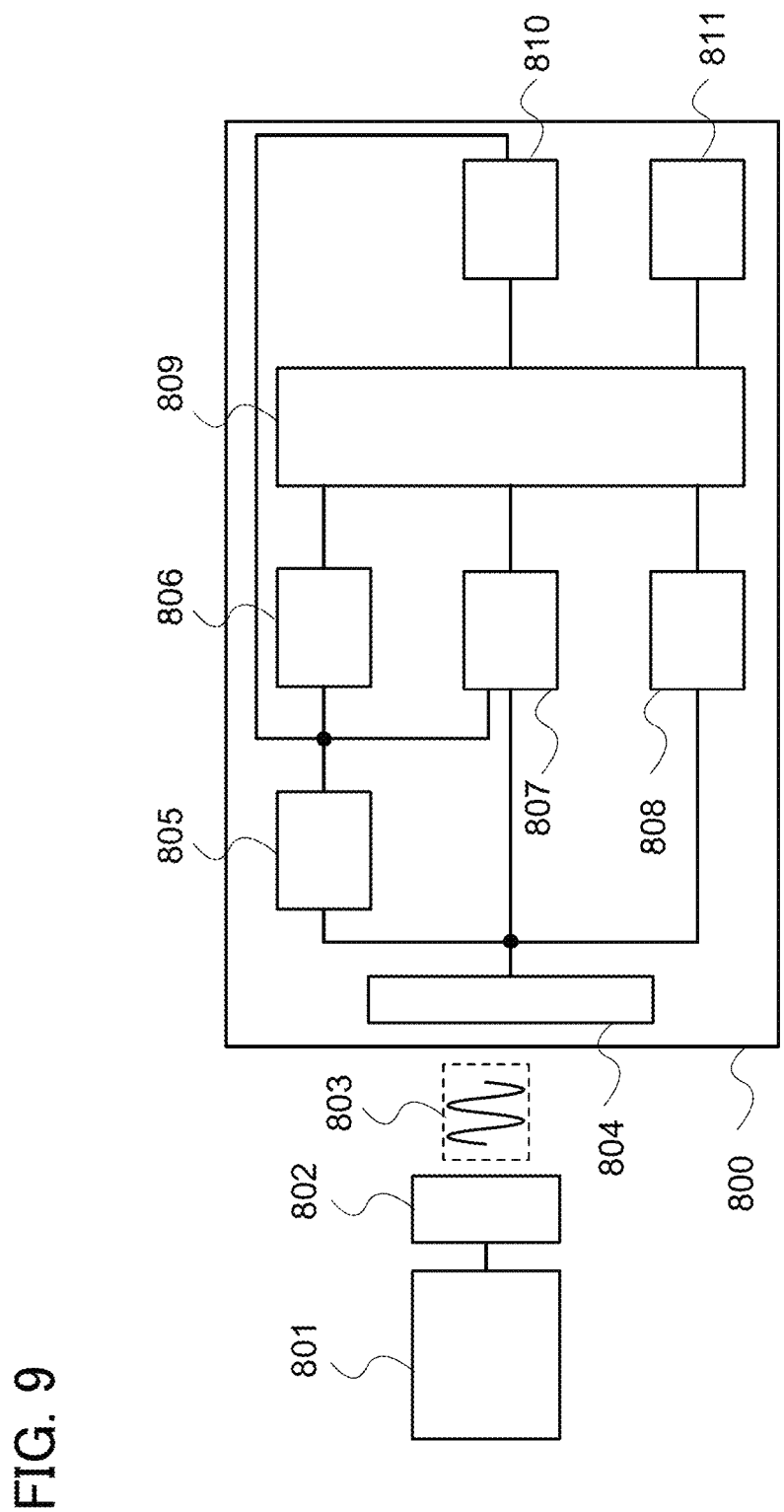
FIG. 9 illustrates a structure example of an RFID tag of one embodiment.

As shown in FIG. 9, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electric wave method by which communication is performed using an electric wave. Any of these methods can be used in the RFID tag 800 described in this embodiment.

Next, a structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RFID tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the embodiments described in this specification as appropriate.

Embodiment 7

In this embodiment, description is given of a CPU in which at least the transistor described in any of the above embodiments can be used and the memory device described in the above embodiment is included.

Figure 10:
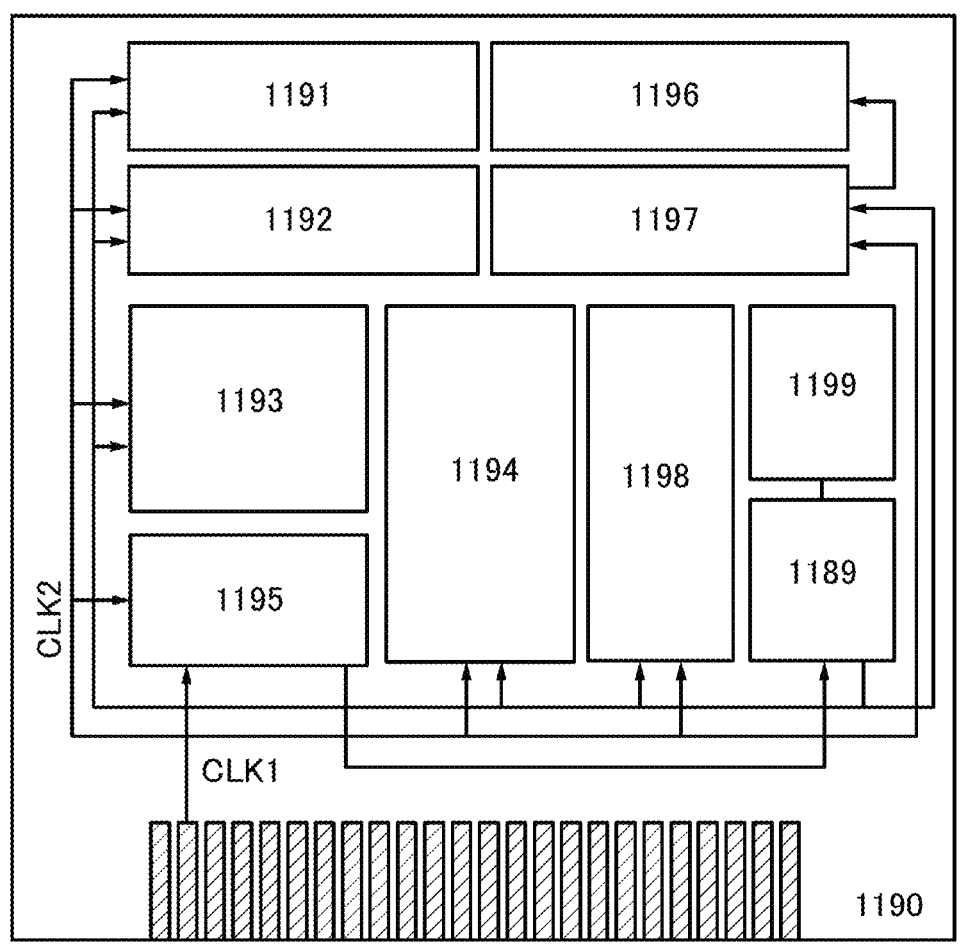
FIG. 10 illustrates a structure example of a CPU of one embodiment.

FIG. 10 is a block diagram illustrating a configuration example of a CPU at least partly including any of the transistors described in the above embodiments as a component.

The CPU illustrated in FIG. 10 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 10 is just an example in which the configuration has been simplified, and an actual CPU may have a variety of configurations depending on the application. For example, the CPU may have the following configuration: a structure including the CPU illustrated in FIG. 10 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 10, a memory cell is provided in the register 1196. For the memory cell of the register 1196, any of the transistors described in the above embodiments can be used.

In the CPU illustrated in FIG. 10, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 11:
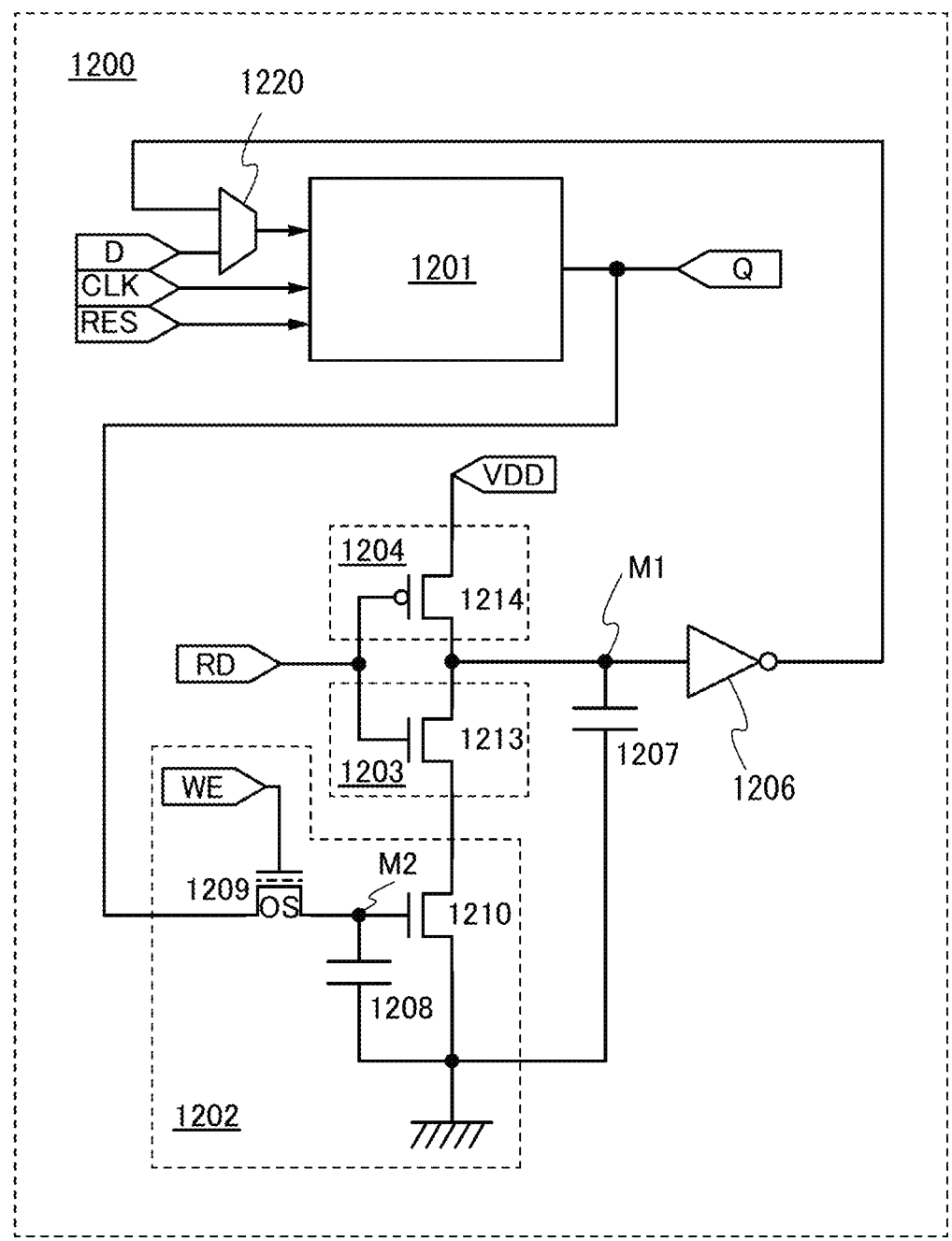
FIG. 11 is a circuit diagram of a memory element of one embodiment.

FIG. 11 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203. The second terminal of the switch 1203 is electrically connected to the first terminal of the switch 1204. The second terminal of the switch 1204 is electrically connected to a line which can supply a power supply potential VDD. The second terminal of the switch 1203, the first terminal of the switch 1204, an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 11 illustrates an example in which a signal output from the circuit 1201 is input to the other of the source and the drain of the transistor 1209. The logic value of a signal output from the second terminal of the switch 1203 is inverted by the logic element 1206, and the inverted signal is input to the circuit 1201 through the circuit 1220.

In the example of FIG. 11, a signal output from the second terminal of the switch 1203 is input to the circuit 1201 through the logic element 1206 and the circuit 1220; however, one embodiment of the present invention is not limited thereto. The signal output from the second terminal of the switch 1203 may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 can be input to the node.

In FIG. 11, the transistors included in the memory element 1200 except for the transistor 1209 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 11, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

Embodiment 8

In this embodiment, a configuration example of a display device of one embodiment of the present invention is described with reference to drawings.

Structure Example

Figure 20A:
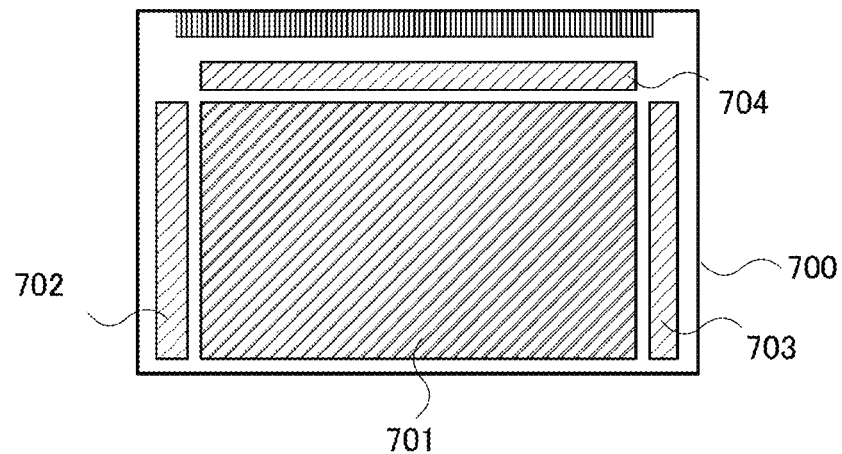
FIGS. 20A to 20C are a structural example and circuit diagrams of a display device of one embodiment.
Figure 20B:
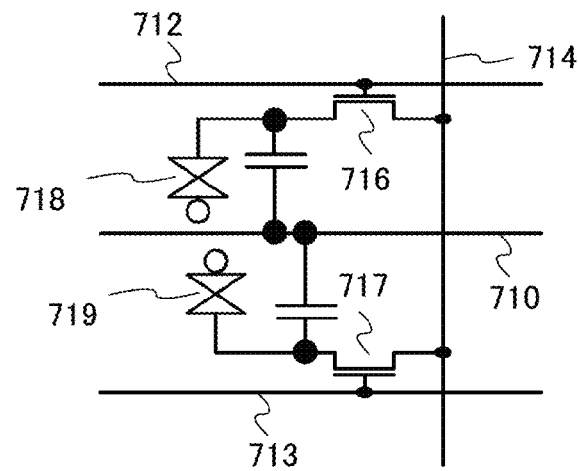
Figure 20C:
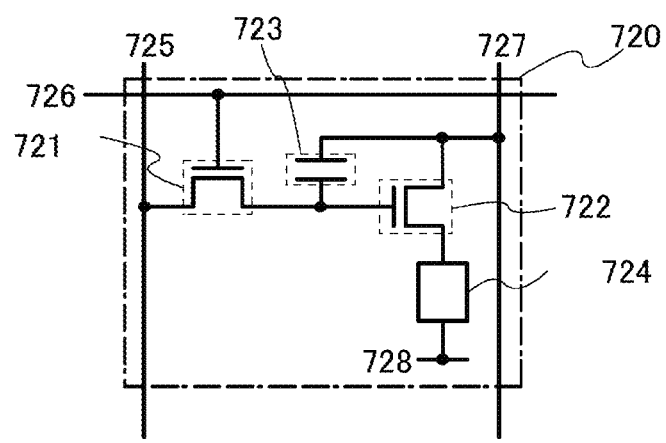

FIG. 20A is a top view of the display device of one embodiment of the present invention. FIG. 20B is a circuit diagram illustrating a pixel circuit that can be used in the case where a liquid crystal element is used in a pixel in the display device of one embodiment of the present invention. FIG. 20C is a circuit diagram for illustrating a pixel circuit that can be used in the case where an organic EL element is used in a pixel in the display device of one embodiment of the present invention.

The transistor in the pixel portion can be formed in accordance with the above embodiment. Further, the transistor can easily be an n-channel transistor, and thus, part of a driver circuit that can be formed using an n-channel transistor in the driver circuit is formed over the same substrate as the transistor of the pixel portion. With the use of the transistor described in the above embodiment for the pixel portion or the driver circuit in this manner, a highly reliable display device can be provided.

FIG. 20A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels each including a display element are provided in matrix in respective regions in each of which the scan line and the signal line intersect with each other. The substrate 700 of the display device is connected to a timing control circuit (also referred to as a controller or a controller IC) through a connection portion such as a flexible printed circuit (FPC).

In FIG. 20A, the first scan line driver circuit 702, the second scan line driver circuit 703, and the signal line driver circuit 704 are formed over the substrate 700 where the pixel portion 701 is formed. Accordingly, the number of components of a driver circuit which is provided outside and the like are reduced, so that a reduction in cost can be achieved. Further, if the driver circuit is provided outside the substrate 700, wirings would need to be extended and the number of connections of wirings would be increased. When the driver circuit is provided over the substrate 700, the number of wiring connections can be reduced and the reliability or yield can be improved.

[Liquid Crystal Display Device]

FIG. 20B illustrates an example of a circuit configuration of the pixel. Here, a pixel circuit which is applicable to a pixel of a VA liquid crystal display device is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 20B. For example, a switch, a resistor, a capacitor, a transistor, a sensor, a logic circuit, or the like may be added to the pixel illustrated in FIG. 20B.

[Organic EL Display Device]

FIG. 20C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 20C illustrates an applicable example of a pixel circuit. In this example, one pixel includes two n-channel transistors. Note that the metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 20C. For example, a switch, a resistor, a capacitor, a sensor, a transistor, a logic circuit, or the like may be added to the pixel circuit illustrated in FIG. 20C.

In the case where the transistor shown in the above embodiments is used for the circuit shown in FIGS. 20A to 20C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device including a display element, a light-emitting element, and a light-emitting device including a light-emitting element can employ a variety of modes or can include a variety of elements. Examples of a display element, a display device, a light-emitting element, or a light-emitting device include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by an electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

At least part of this embodiment can be implemented in combination with any of the embodiments described in this specification as appropriate.

Embodiment 9

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 12A to 12F illustrate specific examples of these electronic devices.

Figure 12A:
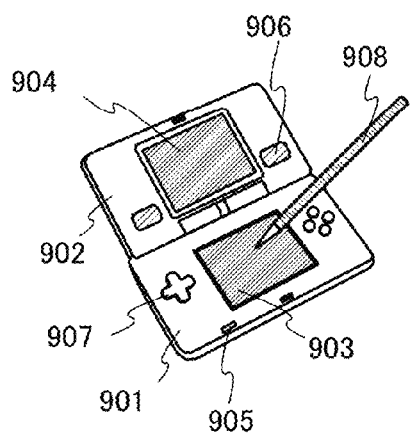
FIG. 12A to 12F each illustrate an electronic device of an embodiment.

FIG. 12A illustrates a portable game console including a housing 901, a housing 902, a display portion 903, a display portion 904, a microphone 905, a speaker 906, an operation key 907, a stylus 908, and the like. Although the portable game console in FIG. 12A has the two display portions 903 and 904, the number of display portions included in a portable game console is not limited to this.

Figure 12B:
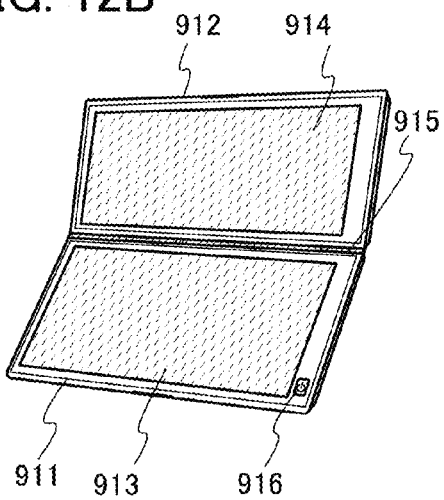

FIG. 12B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 12C:
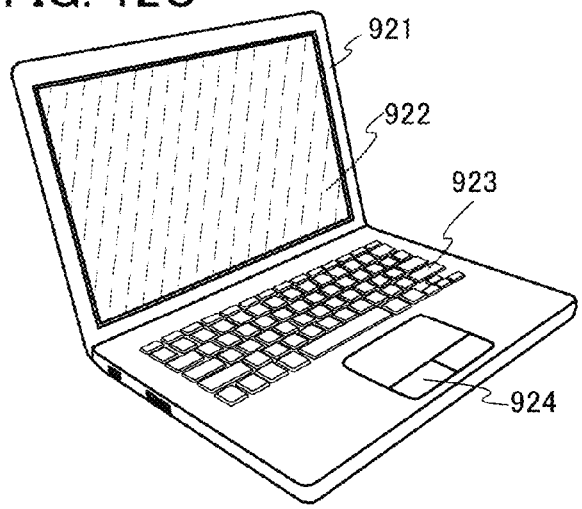

FIG. 12C illustrates a laptop personal computer, which includes a housing 921, a display portion 922, a keyboard 923, a pointing device 924, and the like.

Figure 12D:
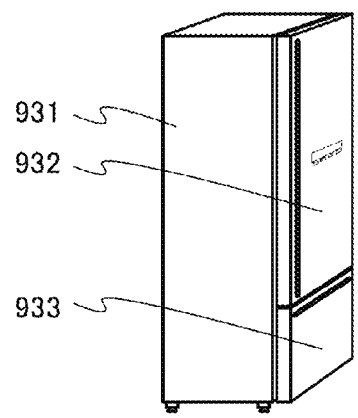

FIG. 12D illustrates the electric refrigerator-freezer including a housing 931, a door for a refrigerator 932, a door for a freezer 933, and the like.

Figure 12E:
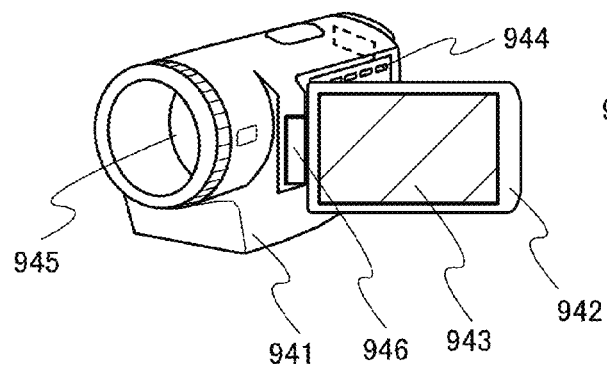

FIG. 12E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 12F:
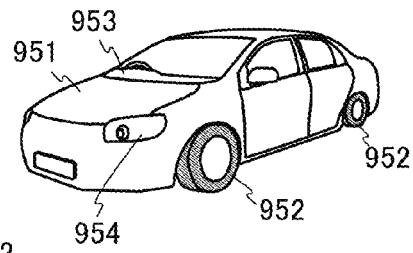
Figure 13A:
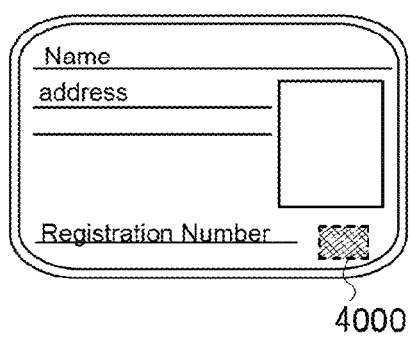
FIGS. 13A to 13F each show an application example of an RFID of one embodiment.
Figure 13B:
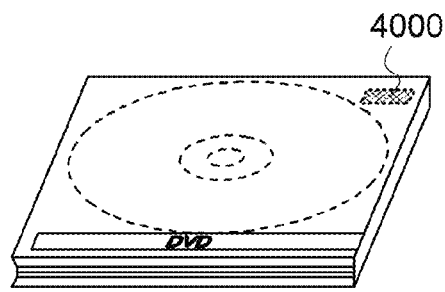
Figure 13C:
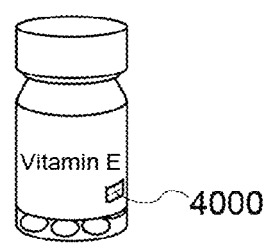
Figure 13D:
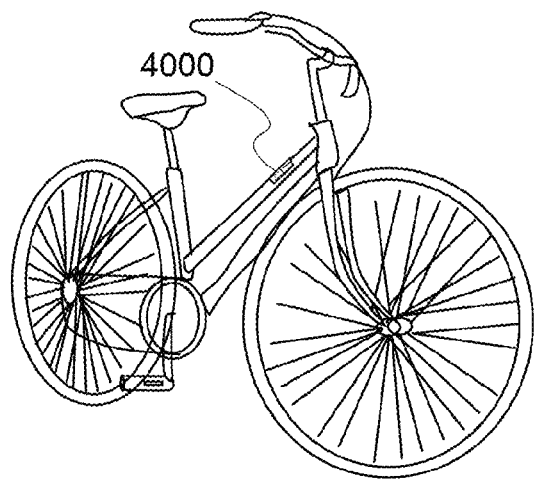
Figure 13E:
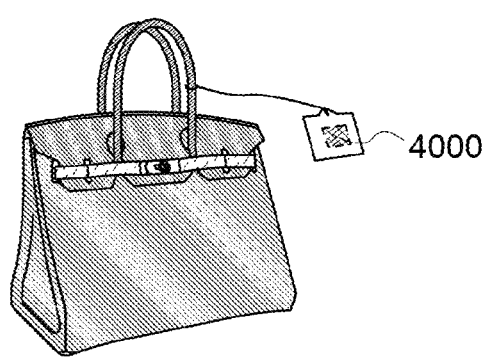
Figure 13F:
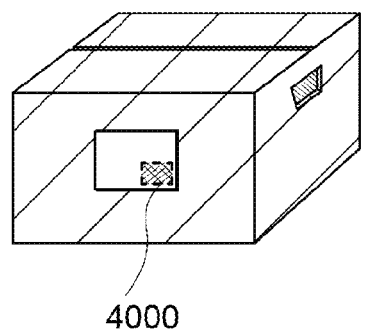

FIG. 12F illustrates an ordinary vehicle including a car body 951, wheels 952, a dashboard 953, lights 954, and the like.

Embodiment 10

In this embodiment, application examples of an RFID of one embodiment of the present invention will be described with reference to FIGS. 13A to 13F. The RFID is widely used and can be provided for, for example, products such as bills, coins, securities, bearer bonds, documents (e.g., driver's licenses or resident's cards, see FIG. 13A), packaging containers (e.g., wrapping paper or bottles, see FIG. 13C), recording media (e.g., DVD software or video tapes, see FIG. 13B), vehicles (e.g., bicycles, see FIG. 13D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 13E and 13F).

An RFID 4000 of one embodiment of the present invention is fixed to a product by being attached to a surface thereof, or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Further, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

In this embodiment, an example in the case where an oxide semiconductor is used in a channel or the like is described, but one embodiment of the present invention is not limited thereto. For example, depending on circumstances or conditions, a material including silicon (Si), germanium (Ge), silicon germanium (SiGe), gallium arsenide (GaAs), or the like may be used in a channel and its vicinity and source or drain regions.

Example 1

In this example, results obtained from a research on elimination of oxygen contained in a ruthenium oxide with thermal desorption spectroscopy (TDS) are described.

In thermal desorption spectroscopy, infrared heating is performed on a sample in high vacuum and released gas molecules are subjected to mass spectrometry, whereby a mass spectrum of a component eliminated from the sample is obtained at each temperature. The degree of vacuum of a background of a measurement apparatus is $1.33 \times 10^{-7}$ Pa ($10^{-9}$ Torr), which enables a component whose amount is extremely small to be analyzed. In this example, EMD-WA1000S manufactured by ESCO Ltd. was used.

Further, the peaks of the curves shown in the results obtained from TDS appear due to release of atoms or molecules contained in the analyzed samples to the outside. The total amount of the atoms or molecules released to the outside corresponds to the integral value of the peak. Thus, the total amount of the atoms or molecules contained in the ruthenium oxide film can be evaluated by the height of the peak intensity.

In this example, a ruthenium oxide film was formed over a silicon wafer by a sputtering method. The formation conditions of the ruthenium oxide film were as follows: the flow rate of oxygen was 20 sccm; the pressure in the treatment chamber was 0.4 Pa; the DC power was 100 W; the distance between a target and the substrate was 60 mm; and the substrate temperature was 150° C. The thicknesses of the ruthenium oxide films were set to 10 nm, 30 nm, 50 nm, 100 nm, and 200 nm. Here, the 10-nm-thick ruthenium oxide film, the 30-nm-thick ruthenium oxide film, the 50-nm-thick ruthenium oxide film, the 100-nm-thick ruthenium oxide film, and the 200-nm-thick ruthenium oxide film are referred to as Sample A, Sample B, Sample C, Sample D, and Sample E, respectively.

Figure 15:
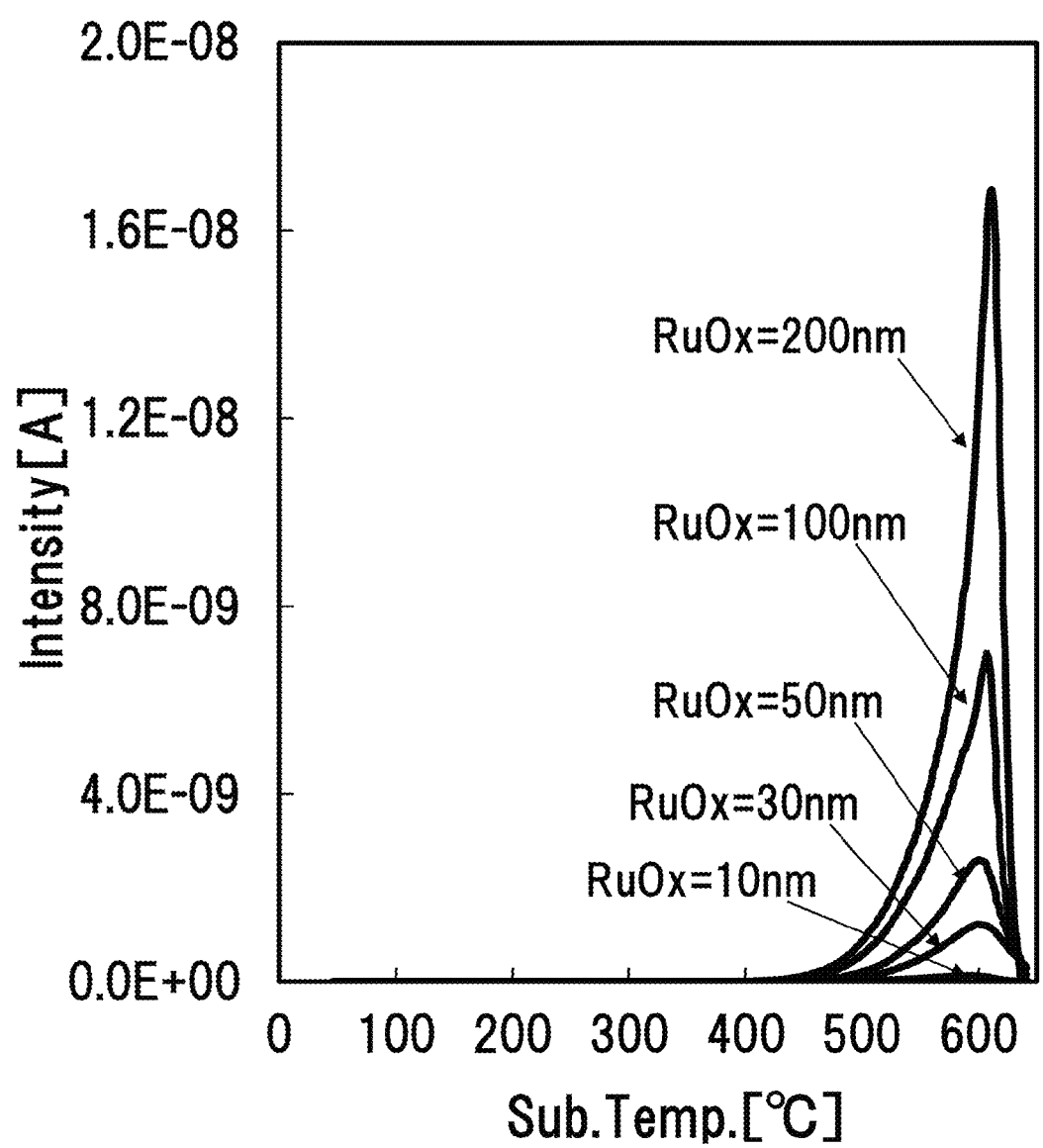
FIG. 15 shows results of TDS.

Next, FIG. 15 shows the results obtained from TDS performed on Sample A to Sample E. FIG. 15 is a graph showing the number of released oxygen molecules against the substrate temperature.

From the results obtained from TDS shown in FIG. 15, release of oxygen molecules was observed even from the 10-nm-thick ruthenium oxide film. Further, it was observed that as the thickness of the ruthenium oxide film is increased, the amount of released oxygen molecules is increased.

From the above results, it is verified that the ruthenium oxide film can release oxygen with heating.

Example 2

In this example, behavior of oxygen in a silicon oxide film by heat treatment is described using secondary ion mass spectrometry (SIMS).

SIMS analysis was performed by using a PHI ADEPT-1010 quadrupole SIMS instrument manufactured by ULVAC-PHI, Inc.

A method for forming the samples is described below.

First, a quartz substrate was prepared, and a silicon oxide film was deposited using $^{18}O_2$ over the quartz substrate. The silicon oxide film was deposited by a sputtering method. Specifically, the silicon oxide film was deposited to a thickness of 300 nm under the following conditions: a silicon oxide target was used, the atmosphere included argon with a flow rate of 25 sccm and oxygen ($^{18}O_2$) with a flow rate of 25 sccm, the pressure was controlled to be 0.4 Pa, the substrate heating temperature at the time of the deposition was 100° C., and the deposition power was 1.5 kW (13.56 MHz).

Here, $^{18}O_2$ is an oxygen molecule which includes an isotope ($^{18}O$) of an oxygen atom with an atomic weight of 18.

Next, a silicon oxide film was deposited over the silicon oxide film using $^{18}O_2$. The silicon oxide film was deposited by a sputtering method. Specifically, the silicon oxide film was deposited to a thickness of 100 nm under the following conditions: a silicon oxide target was used, the atmosphere included argon with a flow rate of 25 sccm and oxygen with a flow rate of 25 sccm, the pressure was controlled to be 0.4 Pa, the substrate heating temperature at the time of the deposition was 100° C., and the deposition power was 1.5 kW (13.56 MHz). The silicon oxide film did not include $^{18}O$ intentionally.

Heat treatment for an hour at 150° C., 250° C., 350° C., and 550° C. was performed on the samples manufactured in such a manner, in a nitrogen atmosphere. Further, a sample on which heat treatment was not performed was prepared (called as-depo).

Figure 16:
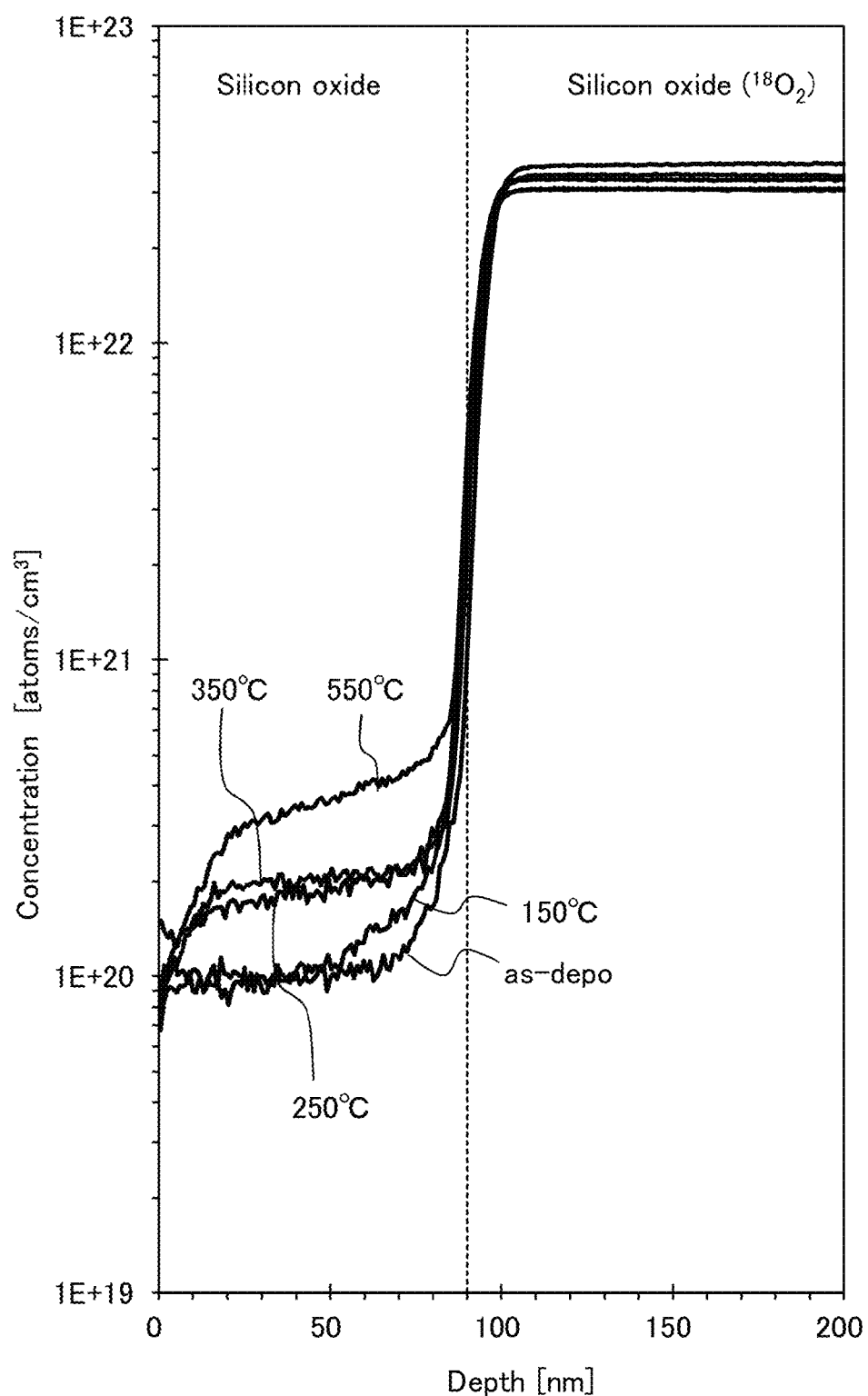
FIG. 16 shows a drawing explaining diffusion of oxygen in a silicon oxide film.

FIG. 16 shows analysis results of $^{18}O$ in the depth direction by SIMS. In FIG. 16, "as-depo", "150° C.", "250° C.", "350° C.", and "550° C." represent the conditions of the heat treatment. The right side of a dashed line in FIG. 16 shows the silicon oxide film (referred to as silicon oxide ($^{18}O_2$)) deposited using $^{18}O_2$.

From FIG. 16, it was found that $^{18}O$ is diffused from the silicon oxide film deposited using $^{18}O_2$ to the silicon oxide film by the heat treatment. Further, it was found that as the temperature of the heat treatment is higher, the amount of $^{18}O$ diffused from the silicon oxide film deposited using $^{18}O_2$ to the silicon oxide film is increased.

As a result, oxygen is diffused into the silicon oxide film at a depth of approximately 40 nm, even by heat treatment at approximately 150° C.

This example shows that oxygen is diffused into a silicon oxide film by heat treatment.

This application is based on Japanese Patent Application serial no. 2013-191505 filed with Japan Patent Office on Sep. 17, 2013, the entire contents of which are hereby incorporated by reference.

What is claimed is:

1. A semiconductor device, comprising:
an oxide semiconductor layer;
a gate electrode over the oxide semiconductor layer; and
a gate insulating film between the oxide semiconductor layer and the gate electrode;
wherein a thickness of the oxide semiconductor layer is greater than or equal to a width of the oxide semiconductor layer,
wherein the gate electrode faces a top surface of the oxide semiconductor layer and a side surface of the oxide semiconductor layer,
wherein the gate electrode includes a first region and a second region,
wherein the first region is in contact with the gate insulating film, and
wherein the first region has lower oxygen concentration than the second region.

2. The semiconductor device according to claim 1, wherein the first region of the gate electrode is a region reduced by heat treatment and oxygen released from the first region of the gate electrode is supplied to the oxide semiconductor layer through the gate insulating film.

3. The semiconductor device according to claim 1, wherein the first region of the gate electrode includes a substance having higher Gibbs free energy for oxidation than the gate insulating film.

4. The semiconductor device according to claim 1, wherein the first region of the gate electrode includes one or more elements selected from the group consisting of silver, copper, ruthenium, iridium, platinum, and gold.

5. The semiconductor device according to claim 1, wherein the gate insulating film has an oxygen-transmitting property.

6. The semiconductor device according to claim 1, wherein the oxide semiconductor layer comprises indium, gallium and zinc.

7. The semiconductor device according to claim 1, wherein the oxide semiconductor layer comprises crystals whose c-axes are aligned in a direction perpendicular to a top surface of the oxide semiconductor layer.

8. An electronic device, comprising:
the semiconductor device according to claim 1; and
at least one of a microphone, a speaker, and an operation key.

9. A semiconductor device, comprising:
a first gate electrode;
an oxide semiconductor layer over the first gate electrode;
a second gate electrode over the oxide semiconductor layer;
a first gate insulating film between the oxide semiconductor layer and the first gate electrode; and
a second gate insulating film between the oxide semiconductor layer and the second gate electrode,
wherein a thickness of the oxide semiconductor layer is greater than or equal to a width of the oxide semiconductor layer,
wherein the second gate electrode faces a top surface of the oxide semiconductor layer and a side surface of the oxide semiconductor layer,
wherein the first gate electrode faces a bottom surface of the oxide semiconductor layer,
wherein the first gate electrode includes a first region and a second region,
wherein the second gate electrode includes a first region and a second region,
wherein the first region of the first gate electrode is in contact with the first gate insulating film,
wherein the first region of the second gate electrode is in contact with the second gate insulating film,
wherein the first region of the first gate electrode has lower oxygen concentration than the second region of the first gate electrode, and
wherein the first region of the second gate electrode has lower oxygen concentration than the second region of the second gate electrode.

10. The semiconductor device according to claim 9, wherein the first region of the first gate electrode is a region reduced by heat treatment and oxygen released from the first region of the first gate electrode is supplied to the oxide semiconductor layer through the first gate insulating film.

11. The semiconductor device according to claim 9, wherein the first region of the first gate electrode includes a substance having higher Gibbs free energy for oxidation than the first gate insulating film, and
wherein the first region of the second gate electrode includes a substance having higher Gibbs free energy for oxidation than the second gate insulating film.

12. The semiconductor device according to claim 9, wherein the first region of the first gate electrode and the first region of the second gate electrode each include one or more elements selected from the group consisting of silver, copper, ruthenium, iridium, platinum, and gold.

13. The semiconductor device according to claim 9, wherein the first gate insulating film and the second gate insulating film have an oxygen-transmitting property.

14. The semiconductor device according to claim 9, wherein the oxide semiconductor layer comprises indium, gallium and zinc.

15. The semiconductor device according to claim 9, wherein the oxide semiconductor layer comprises crystals whose c-axes are aligned in a direction perpendicular to a top surface of the oxide semiconductor layer.

16. An electronic device, comprising:
the semiconductor device according to claim 9; and
at least one of a microphone, a speaker, and an operation key.

17. A semiconductor device, comprising:
an oxide semiconductor layer;
a gate electrode over the oxide semiconductor layer; and
a gate insulating film between the oxide semiconductor layer and the gate electrode;
wherein a thickness of the oxide semiconductor layer is greater than or equal to a width of the oxide semiconductor layer,
wherein the gate electrode faces a top surface of the oxide semiconductor layer and a side surface of the oxide semiconductor layer,
wherein the gate electrode includes a first region closer to the oxide semiconductor layer and a second region farther from the oxide semiconductor layer, and
wherein the first region has lower oxygen concentration than the second region.

18. The semiconductor device according to claim 17, wherein the oxide semiconductor layer comprises indium, gallium and zinc.

19. The semiconductor device according to claim 17, wherein the oxide semiconductor layer comprises crystals whose c-axes are aligned in a direction perpendicular to a top surface of the oxide semiconductor layer.

20. An electronic device, comprising:
the semiconductor device according to claim 17; and
at least one of a microphone, a speaker, and an operation key.

* * * * *